(12) United States Patent
Bharathraj et al.

(10) Patent No.: US 12,253,569 B2
(45) Date of Patent: Mar. 18, 2025

(54) METHODS AND SYSTEMS FOR SAFETY ASSESSMENT OF A BATTERY

(71) Applicant: Samsung Electronics Co., Ltd., Suwon-si (KR)

(72) Inventors: Sagar Bharathraj, Bangalore (IN); Shashishekara Parampalli Adiga, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 347 days.

(21) Appl. No.: 17/723,917

(22) Filed: Apr. 19, 2022

(65) Prior Publication Data

US 2022/0342002 A1   Oct. 27, 2022

(30) Foreign Application Priority Data

Apr. 27, 2021  (IN) .............................. 202141019285
Jan. 5, 2022   (IN) .............................. 202141019285
Mar. 11, 2022  (KR) ........................ 10-2022-0030902

(51) Int. Cl.

| | | |
|---|---|---|
| *G01R 31/392* | (2019.01) | |
| *G01R 31/388* | (2019.01) | |
| *H01M 10/44* | (2006.01) | |
| *H02J 7/00* | (2006.01) | |
| *G01R 1/20* | (2006.01) | |

(52) U.S. Cl.
CPC ......... *G01R 31/392* (2019.01); *G01R 31/388* (2019.01); *H01M 10/44* (2013.01); *H02J 7/0049* (2020.01); *H02J 7/005* (2020.01); *G01R 1/203* (2013.01)

(58) Field of Classification Search
CPC .. G01R 31/392; G01R 31/388; G01R 31/367; G01R 31/382; G01R 31/52; G01R 1/203; G01R 25/00; H01M 10/44; H01M 10/425; H01M 10/48; H01M 10/488; H01M 2010/4271; H01M 2010/4278; H02J 7/0049; H02J 7/005; Y02E 60/10; G08B 21/182; G08B 21/185
See application file for complete search history.

(56) References Cited

U.S. PATENT DOCUMENTS

| | | | |
|---|---|---|---|
| 8,643,332 B2 | 2/2014 | Yokotani | |
| 10,295,606 B2 | 5/2019 | McCoy | |
| 10,302,703 B2 * | 5/2019 | Fleischer | ............... G01R 31/52 |

(Continued)

FOREIGN PATENT DOCUMENTS

| | | |
|---|---|---|
| CN | 102565611 B | 8/2014 |
| CN | 108544925 B | 10/2019 |

(Continued)

*Primary Examiner* — Catherine T. Rastovski
*Assistant Examiner* — Lal C Mang
(74) *Attorney, Agent, or Firm* — NSIP Law

(57) ABSTRACT

A method and apparatus for determining safety of a battery are disclosed, where the method includes identifying a charge state or a discharge state of the battery, activating pulse probe currents at different depths of charge or discharge (charge/discharge) of the battery, in response to identifying the charge or discharge state of the battery, and detecting and differentiating between a state of short (SOS) and a state of health (SOH) of the battery based on variations of the pulse probe currents as a function of the depths of charge/discharge.

20 Claims, 16 Drawing Sheets

(56) References Cited

U.S. PATENT DOCUMENTS

| | | | |
|---|---|---|---|
| 2011/0060538 A1* | 3/2011 | Fahimi | G01R 31/392 |
| | | | 702/63 |
| 2017/0214253 A1* | 7/2017 | Kim | H02J 7/0018 |
| 2018/0262027 A1* | 9/2018 | Jung | H02J 7/00309 |

FOREIGN PATENT DOCUMENTS

| | | |
|---|---|---|
| JP | 4995643 B2 | 8/2012 |
| KR | 10-1930647 B1 | 3/2019 |
| KR | 10-2020-0101754 A | 8/2020 |
| KR | 10-2021-0000207 A | 1/2021 |

\* cited by examiner

|  | No Degradation | Degradation |
|---|---|---|
| No Short | CLE (test cell) ≅ CLE (fresh cell)<br>For all DODs | CLE (test cell) < CLE (fresh cell)<br>For (DOD < 20%)<br>&<br>[CLE (test cell)] / [CLE (fresh cell)]<br>for (20% < DOD < 90%) ~ constant |
| Short | CLE (test cell) ≅ CLE (fresh cell)<br>For (DOD < 20%)<br>&<br>[CLE (test cell)] / [CLE (fresh cell)]<br>decreased with<br>DOD for (20% < DOD < 90%) | CLE (test cell) < CLE (fresh cell)<br>For (DOD < 20%)<br>&<br>[CLE (test cell)] / [CLE (fresh cell)]<br>decreased with<br>DOD for (20% < DOD < 90%) |

FIG. 8

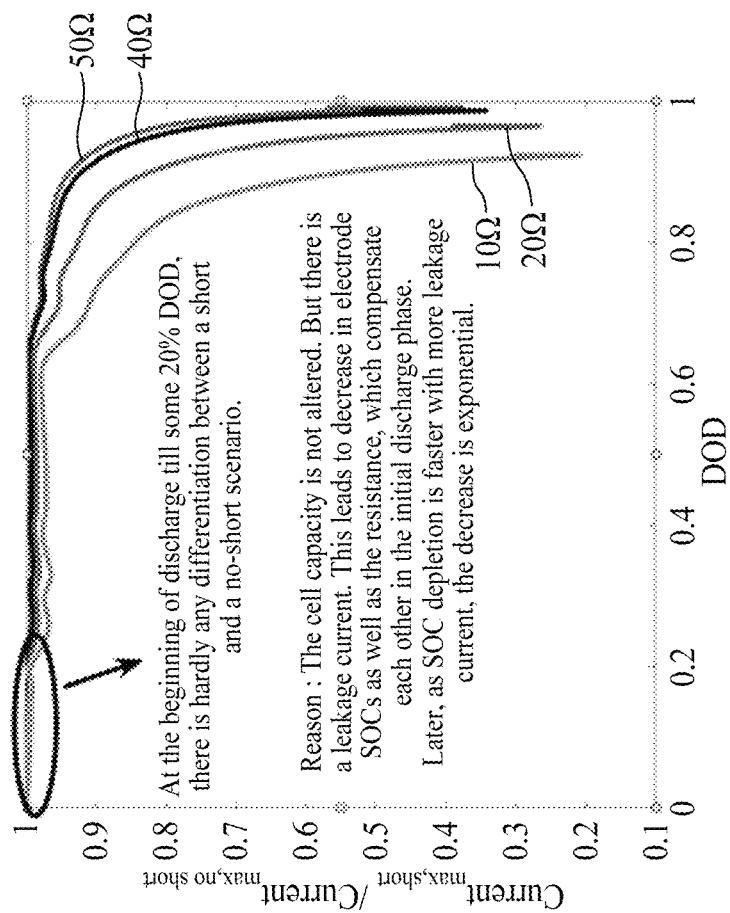
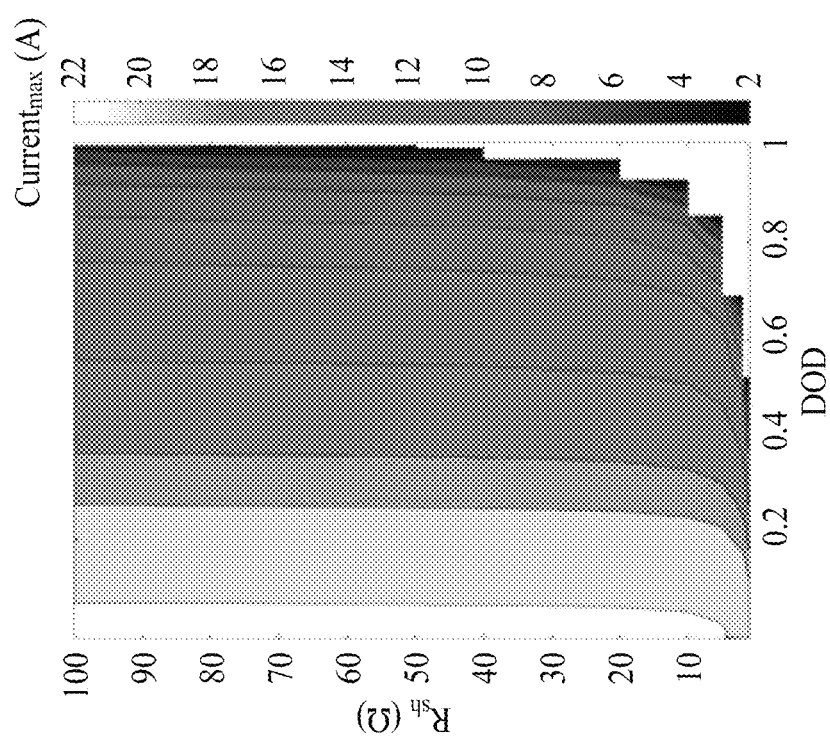
FIG. 10B

METHODS AND SYSTEMS FOR SAFETY ASSESSMENT OF A BATTERY

CROSS REFERENCE TO RELATED APPLICATION

This application claims the benefit under 35 USC § 119(a) of Indian Patent Application No. 2021 41 01 9285 filed on Apr. 27, 2021, Indian Patent Application No. 2021 41 01 9285 filed on Jan. 5, 2022, in the India Patent Office, and Korean Patent Application No. 10-2022-0030902 filed on Mar. 11, 2022, in the Korean Intellectual Property Office, the entire disclosures of which are incorporated herein by reference for all purposes.

BACKGROUND

1. Field

The present disclosure relates to methods and apparatuses for assessing safety of a battery based on pulse probe current.

2. Description of Related Art

Adoption of batteries, such as, Lithium Ion (Li-ion) batteries, is gaining popularity by expanding from consumer electronics to mobility and grid storage. Safety of these batteries is important because malfunctions in the batteries, like internal short circuits, may have life threatening consequences. Internal short circuits may develop in the batteries due to lithium dendrite growth or mechanical abuse that punctures a separator causing an additional $I^2R$ (wherein 'I' is current and 'R' is resistance) thermal mass that fuels exothermic breakdown of electrolytes leading up to thermal runaways. If the internal short circuits are not detected in early stages and mitigation is not undertaken, the internal short circuits may lead to the thermal runaways with serious safety concerns (for example, catching fire or other catastrophic incidents). Therefore, diagnosing and prognosticating the internal short circuits are of great significance to improve the safety of the batteries and user experience.

Detection of the internal short circuits in its early stages (i.e., a soft short) may be difficult, as signatures related to the internal short circuits such as, decrease in terminal voltage, temperature rise, or the like, do not appear until it's too late for any prudent action to be undertaken (as depicted in FIG. 1). At an onset of an internal short circuit, a shunt resistance may be very high (10-1000 ohm ($\Omega$)) (soft short), which decreases over a period of time leading to a hard short circuit and eventually the thermal runaway. However, due to the high shunt resistance, a shunt current to be detected may be very low. Therefore, the internal short circuits have to be detected at an early state for alerting a user and a detection method used for detecting the internal short circuits has to be very efficient and fast enough to be implemented on a battery management system.

In conventional approaches, a long-term and exploratory method has been used for a safer battery design either via all solid state batteries by eliminating flammable organic electrolytes, or an in-built safe mechanism that arrests the catastrophic failure.

Another conventional approach may use a short-term realizable method through an early warning system, where purpose-built methods on-board the battery management system detect the internal short circuits well in advance of the thermal runaways. Even when the longer term safer battery design is realized, the longer term safer battery design may be used in combination with the short-term realizable method as less severe internal short circuits may still occur.

Another approach may be desirable as there may be a long incubation time for the internal short circuits to grow from soft internal short circuits to the hard internal short circuits that leads to a failure. Thus, the early detection of the internal short circuits even as the battery is being cycled may enable a warning to the user and avert a catastrophic event.

Most of the conventional approaches (including the above described exemplary conventional approaches) may employ statistical and estimation techniques that involve a comparison of features extracted from a voltage, a current, and temperature data with those of a healthy reference cells. In case of battery packs, comparisons between voltage curves of individual cells present in the battery packs may also have been used to detect the internal short circuits. Also, different observers such as, an extended Kalman filter (EKF), a Luenberger observer, or the like may be employed to detect the internal short circuit.

In the recent conventional approaches, data driven methods and machine learning have been proposed to detect the internal short circuits. The internal short circuit may be detected by estimating an internal short circuit resistance, as the internal short circuit resistance allows for verifying a presence of the internal short circuit by calculating a capacity loss due to an internal short circuit current and also allowing for tracking a growth of the internal short circuit.

However, detecting the internal short circuit in its nascent stage may be difficult, as the internal short circuit influences on battery performance is very subtle and thus the signatures are very weak. Particularly, an often-explored method of relying on the temperature variation is not sensitive enough in the early stages of the internal short circuit and tracking voltage, as a (dis)charge capacity requires performing special probe cycles that may not be practical. Also, the signatures related to the internal short circuit may be common to other phenomena like degradation-induced ageing as well. Thus, the conventional approaches do not detect the internal short circuit in its inception stage, as the signatures related to the internal short circuit may be data intensive and feature centric. In addition, as the conventional approaches do not detect the internal short circuit in its inception, it may lead to protocols being "too little too late", inaccurate, computationally expensive, and impractical for implementation on the battery management system.

Further, the above-described conventional approaches may have the drawbacks of detecting the internal short circuit, by estimating the internal short circuit resistance/ shunt resistance of only lesser than 200 (i.e., the hard internal short circuit); requiring a lot of data or many cycles to assess the internal short circuit; requiring a complicated method with many features that requires full cycle data or significantly long time to record such features; requiring a lot of memory (for example, at least 50 cycles of data), which results in less computing efficiency; detecting the internal short circuit with an accuracy depending on an amount of data used (typically <90% for R>500); and requiring specific points in charge and discharge of the battery that increases a need to capture predetermined battery response features over more than 50 cycles at least.

Thus, a simple and accurate real-time method for detection and estimation of the battery safety as well as health parameters is required, which may push battery system boundaries both in terms of its diversification in applications and extremities of its performance limits.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a processor implemented method for determining safety of a battery, the method including identifying, by the processor, a charge state or a discharge state of the battery, activating, by the processor, pulse probe currents at different depths of charge or discharge (charge/discharge) of the battery, in response to identifying the charge or discharge state of the battery, and detecting and differentiating, by the processor, between a state of short (SOS) and a state of health (SOH) of the battery based on variations of the pulse probe currents as a function of the depths of charge/discharge.

A pulse probe current may include a maximum extractable discharge current from the battery at a given depth of charge/discharge and temperature.

The SOS may indicate at least one internal short circuit in the battery and the SOH indicates a degradation of the battery.

The detecting and differentiating between the SOS and the SOH may include obtaining operating and environment conditions including real-time changes in operating conditions of the battery in response to the activated pulse probe currents at the different depths of charge/discharge, wherein the operating and environment conditions of the battery comprise any one or any combination of a current, a voltage, a state of (dis)charge (SOC), and a temperature, estimating a current limit estimate (CLE) of the battery for the different depths of charge/discharge, based on the operating and environment conditions of the battery, wherein the CLE comprises an extractable current with respect to the variations of the activated pulse probe currents at the different depths of charge/discharge, comparing the CLE estimated for a first depth of charge/discharge with a CLE of a fresh cell estimated for the same depth of charge/discharge, wherein the fresh cell is of the same or different battery, detecting the SOH of the battery, in response to the CLE for the first depth of charge/discharge being less than a pre-determined amount of the CLE of the fresh cell for the same depth of discharge, comparing the CLE estimated for all the subsequent depths of charge/discharge of the battery with the CLE of the fresh cell estimated for corresponding depths of charge/discharge, in response to the CLE estimated for the first depth of discharge not being less than the pre-determined amount of the CLE of the fresh cell for the same depth of discharge, and detecting the SOS of the battery, in response to the CLE estimated for all the subsequent depths of charge/discharge being less than the CLE of the fresh cell estimated for the corresponding depths of charge/discharge.

The method may include determining whether the CLE remains constant for all the depths of charge/discharge, in response to detecting the SOH, detecting the SOH of the battery, in response to the CLE remaining constant for all the depths of charge/discharge, and detecting the SOS and the SOH of the battery, in response to the CLE not remaining constant for all the depths of charge/discharge of the battery.

The CLE may predict the pulse probe current that the battery sustains over a short period of time before reaching a pre-determined voltage cut-off at a particular SOC and temperature.

The estimating of the CLE may include collecting operating or environment conditions of the battery from a reduced order model (ROM)-thermal loop based on the operating and environment conditions of the battery, wherein the operating or environment conditions of the battery collected from the ROM-thermal loop comprises any one or any combination of a current identified in a real-time, a lumped temperature, a lumped resistance, the SOC, and model parameters, collecting inputs for estimating the CLE, wherein the inputs comprises any one or any combination of, a voltage cut-off, a first-time instance over that the battery sustains the maximum current, initially identifying the CLE as the current identified in the real-time, calculating the SOC for at least one subsequent time instance as a SOC cut-off, and estimating the CLE based on an open circuit voltage, the SOC cut-off, the voltage cut-off, and the lumped resistance.

The method may include checking if a relative change of the CLE is less than a pre-determined change value, detecting a presence of a convergence and estimating the CLE recursively until an absence of the convergence or the relative change of the CLE is equal to the pre-determined change value, in response to the relative change of the CLE being less than the pre-determined change value, detecting the absence of the convergence, in response to the relative change of the CLE being greater than the pre-determined change value, and recursively calculating the SOC for the subsequent time instance as the subsequent SOC cut-off and estimating the CLE until the presence of the convergence or the relative change of the CLE is equal to the pre-determined change value, in response to detecting the absence of the convergence.

The method may include estimating, by the processor, a short resistance value, on detecting the SOS.

The method may include comparing the estimated short resistance value with a pre-determined resistance value, and providing a warning notification to a user, in response to the estimated short resistance value being less than the pre-determined resistance value.

The method may include performing, by the processor, a pulse current limit test at a different charge state or discharge state of the battery to estimate a cumulative charge leakage that attributes to the at least one internal short circuit at each SOS value.

In another general aspect, there is provided a device including a battery, and a battery management system (BMS) controller coupled to the battery configured to, the BMS controller being configured to identify a charge state or a discharge state of the battery, activate pulse probe currents at different depths of charge or discharge (charge/discharge) of the battery, in response to identifying the charge or discharge state of the battery, and detect and differentiate between a state of short (SOS) and a state of health (SOH) of the battery based on variations of the pulse probe currents as a function of the depths of charge/discharge.

A pulse probe current may include a maximum extractable discharge current from the battery at a given depth of charge/discharge and temperature.

The SOS may indicate at least one internal short circuit in the battery and the SOH indicates a degradation of the battery.

The BMS controller may be configured to obtain operating and environment conditions including real-time changes in operating conditions of the battery in response to the activated pulse probe currents at the different depths of charge/discharge, wherein the operating and environment conditions of the battery comprise any one or any combination of, a current, a voltage, a state of (dis)charge (SOC), and a temperature, estimate a current limit estimate (CLE) of the battery for the different depths of charge/discharge, based on the operating and environment conditions of the battery, wherein the CLE comprises an extractable current with respect to the variations of the activated pulse probe currents at the different depths of charge/discharge, compare the CLE estimated for a first depth of charge/discharge with a CLE of a fresh cell estimated for the same depth of charge/discharge, wherein the fresh cell is of the same or different battery, detect the SOH of the battery, in response to the CLE for the first depth of charge/discharge being less than a pre-determined amount of the CLE of the fresh cell for the same depth of discharge, compare the CLE estimated for all the subsequent depths of charge/discharge of the battery with the CLE of the fresh cell estimated for corresponding depths of charge/discharge, in response to the CLE estimated for the first depth of discharge not being less than the pre-determined amount of the CLE of the fresh cell for the same depth of discharge, and detect the SOS of the battery, in response to the CLE estimated for all the subsequent depths of charge/discharge being less than the CLE of the fresh cell estimated for the corresponding depths of charge/discharge.

The BMS controller may be configured to determine whether the CLE remains constant for all the depths of charge/discharge, in response to detecting the SOH, detect the SOH of the battery, in response to the CLE remaining constant for all the depths of charge/discharge, and detect the SOS and the SOH of the battery, in response to the CLE not remaining constant for all the depths of charge/discharge of the battery.

The CLE may predict the pulse probe current that the battery sustains over a short period of time before reaching a pre-determined voltage cut-off at a particular SOC and temperature.

The BMS controller may be configured to collect operating or environment conditions of the battery from a reduced order model (ROM)-thermal loop based on the operating and environment conditions of the battery, wherein the operating or environment conditions of the battery collected from the ROM-thermal loop comprises any one or any combination of, a current identified in a real-time, a lumped temperature, a lumped resistance, the SOC, and model parameters, collect inputs for estimating the CLE, wherein the inputs comprises any one or any combination of, a voltage cut-off, a first-time instance over that the battery sustains the maximum current, initially identify the CLE as the current identified in the real-time, calculate the SOC for at least one subsequent time instance as a SOC cut-off, and estimate the CLE based on an open circuit voltage, the SOC cut-off, the voltage cut-off, and the lumped resistance.

The BMS controller may be configured to check if a relative change of the CLE is less than a pre-determined change value, detect a presence of a convergence and estimating the CLE recursively until an absence of the convergence or the relative change of the CLE is equal to the pre-determined change value, in response to the relative change of the CLE being less than the pre-determined change value, detect the absence of the convergence, in response to the relative change of the CLE being greater than the pre-determined change value, and recursively calculate the SOC for the subsequent time instance as the subsequent SOC cut-off and estimating the CLE until the presence of the convergence or the relative change of the CLE is equal to the pre-determined change value, in response to detecting the absence of the convergence.

The BMS controller may be configured to estimate a short resistance value, on detecting the SOS of the battery, compare the estimated short resistance value with a pre-determined resistance value, and provide a warning notification to a user, in response to the estimated short resistance value being less than the pre-determined resistance value.

Other features and aspects will be apparent from the following detailed description, the drawings, and the claims.

BRIEF DESCRIPTION OF THE DRAWINGS

FIG. 8 illustrates an example of a pulse probe current (PPC) matrix depicting an evaluation of the SOS and the SOH of the battery.

FIGS. 10A-10B illustrate examples of plots depicting the differentiation between the SOH and the SOS of the battery.

Figure 1:
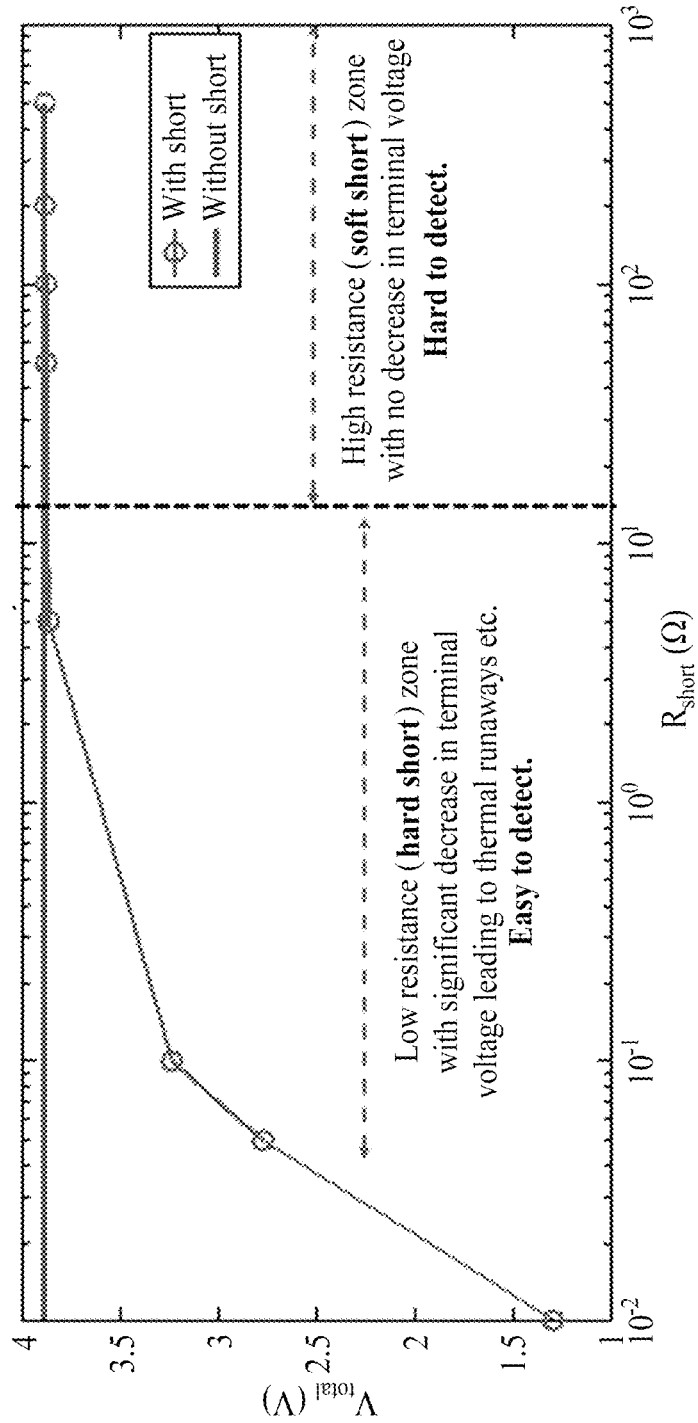
FIG. 1 illustrates an example of a plot depicting variation of signatures of an internal short circuit (a hard or soft internal short circuit).

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular example embodiments only and is not to be limiting of the example embodiments. The singular forms "a", "an", and "the" are intended to include the plural forms as well, unless the context clearly indicates otherwise. As used herein, the term "and/or" includes any one and any combination of any two or more of the associated listed items. It will be further understood that the terms "comprises/comprising," "have/having," and/or "includes/including" when used herein, specify the presence of stated features, integers, steps, operations, elements, and/or components, but do not preclude the presence or addition of one or more other features, integers, steps, operations, elements, components and/or groups thereof.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Although terms such as "first," "second," and "third", A, B, C, (a), (b), (c), or the like may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements. In contrast, when an element is described as being "directly connected to," or "directly coupled to" another element, there can be no other elements intervening therebetween.

Embodiments herein disclose a simple, and accurate method to detect an internal short circuit/state of short (SOS) (for example, a soft short) and determine a soft short resistance value. The method includes charging/or discharging the battery at a pre-determined high rate at specific regions of depths of charge/discharge to obtain a spike current map depicting a spike current limited by a given state of charge (SOC), comparing the obtained spike current map with a spike current map of a fresh cell, and detecting the SOS and the soft short resistance value depending on a decrease in the spike current at the given SOC.

Methods and apparatuses are disclosed for detecting the SOS of the battery in its early stages and estimating the short resistance value; detecting, estimating, and differentiating between a degradation/state of health (SOH) of the battery and the SOS at a time; and providing a warning alarm to a user when the short resistance value goes below a set threshold (for example, 40 Ohms ($\Omega$)).

Figure 2:
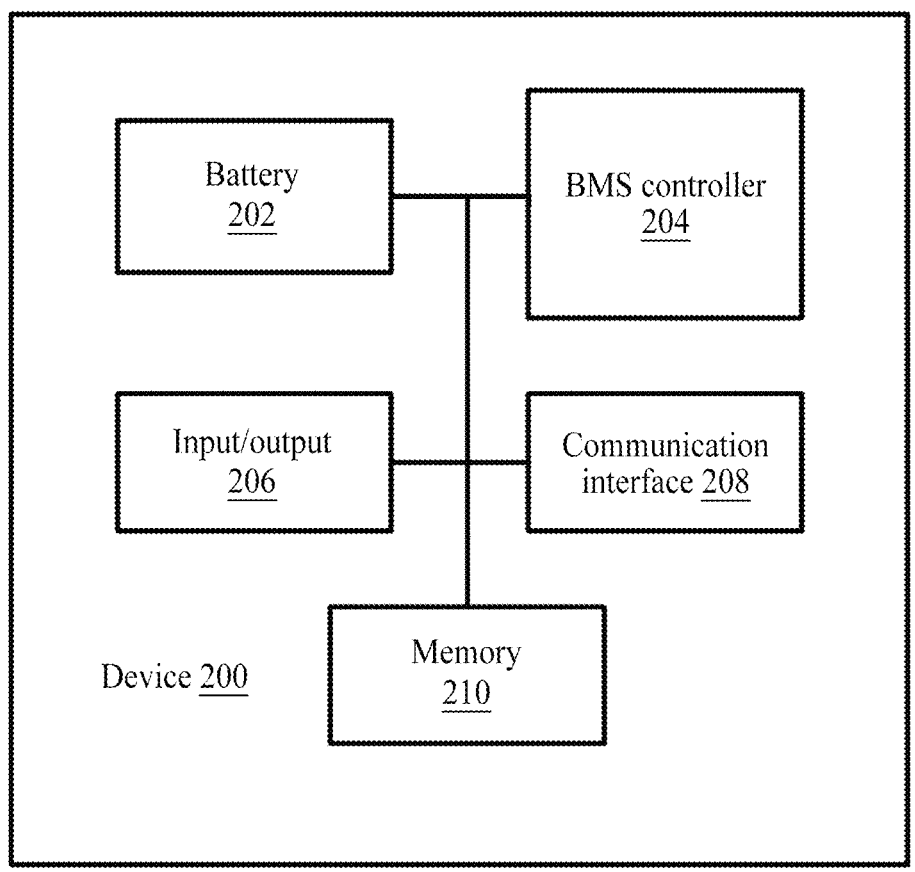
FIG. 2 illustrates an example of a device for assessing safety of a battery.

FIG. 2 is a diagram illustrating an example of components of a device 200 for assessing safety of a battery 202. The device 200 referred herein may be a user device including the battery/batteries/battery packs 202. In an example, the device 200 may include the battery(ies) 202 internally (i.e., on-board battery). In another example, the device 200 may be externally coupled to the battery 202. The device 200 may be externally coupled to a battery unit including the battery 202 using at least one of, but is not limited to, the Internet, a wired network (a Local Area Network (LAN), a Controller Area Network (CAN) network, a Universal Asynchronous Receiver/Transmitter (UART), a bus network, Ethernet and so on), a wireless network (a Wi-Fi network, a cellular network, a Wi-Fi Hotspot, Bluetooth, Zigbee and so on) and so on.

In an example, the device 200 may be implemented in one or more of a computing device, a server (the server may be a standalone server or a server on a cloud), a vehicle, a power supply unit, a charging station, a consumer electronics device, and so on. Examples of the computing device may be, but are not limited to, a mobile phone, a smartphone, a tablet, a phablet, a personal digital assistant (PDA), a laptop, a computer, a wearable computing device, a vehicle infotainment device, an IoT device or any other device that includes the battery 202. Examples of the vehicle may be, but are not limited to, an autonomous vehicle, a semiautonomous vehicle, a manually operated vehicle, an electric vehicle, or any other vehicle that includes the battery 202. In another example, the device 200 may be implemented on any one of a microcontroller, a System on Chip (SoC), an integrated chip (IC), a microprocessor based programmable consumer electronic device, and so on. It is understood that examples of the device 200 described above may not be limited, it may include any other types of devices that include the battery 202 or externally coupled to the battery 202.

The device 200 may be configured to assess safety and other information of the battery 202. The device 200 includes the battery 202, a Battery Management System (BMS) controller 204, an input/output 206, a communication interface 208, and a memory 210. As depicted in FIG. 2, the device 200 includes the on-board battery 202.

Figure 3:
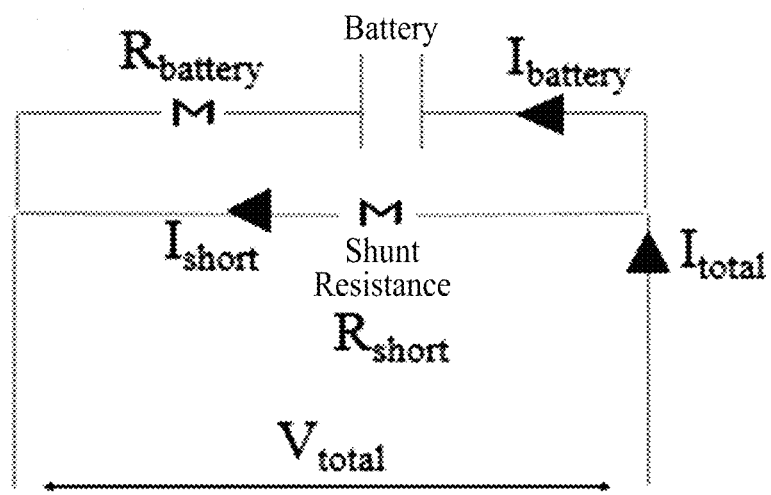
FIG. 3 illustrates an example of an equivalent circuit model of the battery with a shunt resistance.

The battery 202 may be configured to operate the device 200 by providing a power supply to the components 204-210 of the device 200. The battery 202 may include a plurality of electrochemical cells (referred hereinafter as cells through the document) with external connections for powering the device 200. In an embodiment, the battery 202 may include at least one of, but is not limited to, a Lithium-Ion (Li-ion) battery or any other battery constituting chemical composition similar to the Li-ion battery. The battery 202 referred herein may be a chargeable battery. The battery 202 may be charged using an external adapter/charger. An example equivalent circuit model of the battery 202 with a shunt resistance is depicted in FIG. 3.

The BMS controller 204 may include at least one of a single processor, a plurality of processors, multiple homogeneous or heterogeneous cores, multiple CPUs of different kinds, a microcontroller, and other accelerators. Further, the plurality of processors may be located on a single chip or over multiple chips.

In an example, the BMS controller 204 may be configured to assess the safety of the battery 202 by detecting and differentiating a state of short (SOS) and a state of health (SOH) of the battery 202.

The SOS indicates at least one internal short circuit developed in the battery 202. The internal short circuit is a state of the battery 202 in which two electrodes/electrolytes may be internally and electronically interconnected. The internal short circuit may develop in the battery 202 due to lithium dendrite growth or mechanical abuse that punctures a separator causing an additional $I^2R$ (wherein 'I' is a current and 'R' is a resistance) thermal mass that fuels exothermic breakdown of electrolytes leading up to thermal runaways. The BMS controller 204 may detect a soft SOS and a hard SOS. In an example, the soft SOS may be an internal short circuit with a short resistance value less than a threshold value. The threshold value may vary depending on the type of the device 200. For example, if the device 200 is a mobile phone, then the threshold value may vary from 5 Ohms ($\Omega$) to 20$\Omega$. In an example, the hard SOS may be an internal short circuit with the short resistance value equal to or above the threshold value. Embodiments herein use the terms such as "SOS", "internal short circuit (ISC)", "soft short", "short circuit (SC)", "soft SOS", "hard SOS", "shorted battery", "short of the battery", and so on, interchangeably to refer to a state of the battery 202 in which the two electrodes are internally and electronically interconnected.

The SOH indicates a degradation/ageing of the battery 202. The degradation of the battery 202 may be referred to depletion in a strength of the battery 202. Embodiments herein use the terms such as "SOH", "degradation", "ageing", and so on, interchangeably to condition in which the battery 202 has lost the original strength/full capacity.

In an embodiment, differentiating between the SOS and the SOH refers to detecting a difference between an aged and a shorted battery 202. The aged battery 202 may have a diminished capacity due to the degradation. The shorted battery 202 possesses full original capacity, but an access to the battery 202 is limited by the presence of the internal short circuit/short-linked leakage current.

For detecting and differentiating between the SOS and the SOH of the battery 202, the BMS controller 204 identifies a charge state or a discharge state of the battery 202. The charge state depicts charging of the battery 202 and the discharge state depicts discharging of the battery 202. The BMS controller 204 identifies the charge state of the battery 202, when the battery 202 is connected to an external power supply through the adapter. The BMS controller 204 identifies the discharge state of the battery 202, when the battery 202 is losing a voltage.

The BMS controller 204 activates pulse probe currents at different depths of charge or discharge (charge/discharge) of the battery 202. In an example, the BMS controller 204 activates the pulse probe currents at a pre-determined frequency (for example, once every 50 cycles). In another example, the BMS controller 204 activates the pulse probe currents on demand. The pulse probe currents may be activated using various pulse power probe techniques. The pulse probe current is a maximum extractable current from the battery 202 at a given depth of charge/discharge and a temperature. The depth of charge/discharge may be referred to a state of charge/discharge (SOC) of the battery 202.

The BMS controller 204 detects and differentiates between the SOS and the SOH of the battery 202 by analyzing variations of the pulse probe currents as a function of the depths of charge/discharge. In an embodiment, the analyzing of the variations of the pulse probe currents as the function of the depths of charge/discharge refers to estimating an extractable current/current limit estimate (CLE) for the different depths of charge/discharge in response to activating the pulse probe currents at the different depths of charge/discharge and using the CLE for detecting and differentiating between the SOS and the SOH of the battery 202.

For detecting and differentiating between the SOS, and the SOH of the battery 202, the BMS controller 204 obtains instantaneous operating and environment conditions including real-time changes in operating conditions of the battery 202 when the pulse probe currents is activated at the different depths of charge/discharge. In an example, the operating and environment conditions include at least one of, but is not limited to, a current, a voltage, a state of (dis)charge (SOC), a temperature, and so on. The BMS controller 204 estimates the CLE for the different depths of charge/discharge based on the obtained instantaneous operating and environment conditions of the battery 202. The CLE may be the extractable current predicting the pulse probe current that the battery 202 sustains over a short period of time before reaching a pre-determined voltage cut-off at the particular SOC and the temperature. Embodiments herein use the terms such as "CLE", "spike current", "extractable current", "sustainable pulse probe current", and so on, interchangeably to the pulse probe current that can be sustained by the battery 202 over the short period of time before reaching the pre-determined voltage cut-off at the particular SOC and the temperature.

For estimating the CLE, the BMS controller 204 collects operating or environment conditions of the battery 202 from a reduced order model (ROM)-thermal (ROM-T/T-ROM) loop, based on the obtained instantaneous operating and environment conditions of the battery. The operating or environment conditions of the battery 202 collected from the ROM-thermal loop includes at least one of, a current (T) identified in the real-time, a lumped temperature ($T_{lump}$), a lumped resistance ($R_{lump}$), the SOC, model parameters, and so on. The lumped resistance represents a resistance to current through the battery 202 encompassing all influences including electrode/electrolyte transport and kinetic processes.

In an embodiment, the T-ROM loop may accurately account for temperature fluctuation in the cell that influences transport and kinetic processes occurring during the charge and discharge. The T-ROM loop may be used for robust performance across a large temperature range. In accordance with the T-ROM loop, a single representative cell temperature/lumped temperature may be calculated using the following volume averaged expression of heat balance:

$$(\rho C)_{lump}\frac{dT}{dt} = \sum Q_{neg}L_{neg} - \sum Q_{pos}L_{pos} - h_{lump}(T - T_0)|$$

wherein, $$(\rho C)_{lump} = (\rho CL)_{neg} + (\rho CL)_{sep} + (\rho CL)_{pos}$$

$$h_{lump} = \frac{[\text{abs}(h_{pos}) + \text{abs}(h_{neg})]}{2}$$

On collecting the operating or environment conditions of the battery 202 from the ROM-thermal loop, the BMS controller 204 collects inputs for estimating the CLE. Examples of the inputs may be, but are not limited to, a voltage cut-off ($V_{cutoff}$), a first-time instance over that the battery 202 has sustained the maximum current ($\Delta t$), and so on. On collecting the inputs, the BMS controller 204 initially identifies the CLE as the current identified in the real-time (i.e., CLE=I). The BMS controller 204 then calculates the SOC for at least one subsequent time instance (i.e., for next Δt seconds) as a SOC cut-off ($SOC_{cutoff}$). In an embodiment, the $SOC_{cutoff}$ calculation requires using a small loop of the T-ROM loop/module, wherein a solid phase concentration field may be updated every time step. One of the considerations used in the $SOC_{cutoff}$ calculation for the CLE is that for the given time/pulse duration Δt the concentration fields in an electrolyte and the temperature may not vary, as the pulse duration is usually of an order of a few seconds.

On calculating the SOC cut-off, the BMS controller 204 calculates an open circuit voltage (OCV) using the SOC cut-off. The BMS controller 204 estimates the CLE for the different depths of charge/discharge based on the open circuit voltage, the voltage cut-off, and the lumped resistance. In an example, the BMS controller 204 estimates the CLE using the below equation:

$$CLE = \frac{OCV(SOC_{cutoff}) - V_{cutoff}}{R_{lump}}$$

wherein the lumped resistance, $R_{lump}V_{cell}(SOC,T) - OCV(SOC,T)I(t)$

Further, the BMS controller 204 may check if a relative change of the computed CLE is less than a pre-determined change value. In an example, the pre-determined change value may be 0.1% (may vary based on a type of battery 202). If the relative change of the computed CLE is less than the pre-determined change value, the BMS controller 204 may detect a presence of a convergence. On detecting the presence of the convergence, the BMS controller 204 may recursively perform the steps described above for estimating the CLE, until an absence of the convergence or the relative change of the computed CLE is equal to the pre-determined change value. If the relative change of the computed CLE is greater than the pre-determined change value, the BMS controller 204 may determine the absence of the convergence. On determining the absence of the convergence, the BMS controller 204 may recursively perform the steps of calculating the SOC for the subsequent time instance as the subsequent SOC cut off, and estimating the CLE based on the open circuit voltage, the subsequent SOC cut-off, the voltage cut-off, and the lumped resistance, until the relative change of the CLE is equal to the pre-determined change value or the presence of the convergence.

On estimating the CLE for the different depths of charge/discharge, the BMS controller 204 may compare the CLE estimated for a first depth of charge/discharge with a CLE of a fresh cell estimated for the same depth of charge/discharge. In an example, the fresh cell may be a cell of the same battery 202. In another example, the fresh cell may be a cell of the different similar battery 202.

If the CLE estimated for the first depth of charge/discharge is less than a pre-determined amount of the CLE of the fresh cell estimated for the same depth of discharge, the BMS controller 204 may detect the SOH/degradation of the battery 202. In an example, the pre-determined amount may be 98% (may vary based on a type of battery 202). If the CLE estimated for the first depth of charge/discharge is not less than the pre-determined amount of the CLE of the fresh cell estimated for the same depth of discharge (i.e., if there is no SOH/degradation of the battery 202), the BMS controller 204 detects the absence of degradation/SOH of the battery 202 and initiates a process for detecting the SOS in the battery 202.

In another example, on detecting the SOH of the battery 202, the BMS controller 204 may check if the estimated CLE remains constant for all the depths of charge/discharge. If the CLE remains constant for all the depths of charge/discharge, the BMS controller 204 may detect only the SOH/degradation of the battery 202. If the CLE does not remain constant for all the depths of charge/discharge of the battery 202, the BMS controller 204 may predict both the SOS and the SOH of the battery 202 and may initiate the process for detecting the SOS of the battery 202.

For detecting the SOS of the battery 202, the BMS controller 204 compares the CLE estimated for all the subsequent depths of charge/discharge with the CLE of the fresh cell estimated for the same depths of charge/discharge. If the CLE estimated for all the subsequent depths of charge/discharge is less than the CLE of the fresh cell estimated for the same depths of charge/discharge, the BMS controller 204 may detect that the SOS/internal short circuit has developed in the battery 202. If the CLE estimated for all the subsequent depths of charge/discharge is not less than the CLE of the fresh cell estimated for the same depths of charge/discharge, the BMS controller 204 may determine that the battery 202 is healthy (i.e., the absence of the SOS and the SOH).

In an example, wherein the BMS controller 204 estimates the CLE for four different depths of charge/discharge (for example, the depths of charge/discharge=15%, 25%, 50%, 85%). The BMS controller 204 compares the CLE estimated at the first depth of charge/discharge (i.e., depth of charge/discharge=15%) with the CLE of the fresh cell estimated for the same depth of charge/discharge (i.e., depth of charge/discharge=15%). If the CLE estimated for the first depth of charge/discharge is less than 98% of the CLE of the fresh cell estimated for the same depth of charge/discharge, the BMS controller 204 detects the SOH/degradation of the battery 202. If the CLE estimated for the first depth of charge/discharge is not less than 98% of the CLE of the fresh cell estimated for the same depth of charge/discharge, the BMS controller 204 initiates a process of detecting the SOS in the battery 202. For detecting the SOS, the BMS controller 204 compares the CLE estimated for all the subsequent depths of charge/discharge (for example depth of charge/discharge=25%, 50%, and 85%) with the CLE of the fresh cell estimated for the same depths of charge/discharge. If the CLE estimated for all the subsequent depths of charge/discharge is less than the CLE of the fresh cell estimated for the same depths of charge/discharge (i.e., CLE (depth of charge/discharge=25%, 50%, and 85%)<CLE (depth of charge/discharge=25%, 50%, and 85%, fresh cell), the BMS controller 204 detects the SOS in the battery 202.

In an example, on detecting the SOH, the BMS controller 204 checks if the CLE remains constant over the depths of charge/discharge 15%, 25%, 50%, and 85%. If the CLE remains constant over the depths of charge/discharge 15%, 25%, 50%, and 85%, the BMS controller 204 detects only the degradation of the battery 202. If the CLE does not remain constant over the depths of charge/discharge 15%, 25%, 50%, and 85%, the BMS controller 204 detects both the SOS and the SOH/degradation of the battery 202.

On detecting the SOS developed in the battery 202, the BMS controller 204 estimates a short resistance value. In an example, the short resistance value may be a shunt resistance value ($R_{sh}$). The embodiments described herein use the terms such as "short resistance value", "short resistance", "shunt resistance", "internal short circuit resistance value", and so on, interchangeably throughout the document.

On estimating the short resistance value, the BMS controller 204 compares the estimated short resistance with a pre-determined resistance value. In an example herein, the pre-determined resistance value may be 20Ω. If the estimated short resistance value is less than the pre-determined resistance value, the BMS controller 204 provides a warning notification to a user. The warning notification may include the information about the SOS and/or the SOH of the battery 202. The BMS controller 204 may also provide suggestions with the warning notification to the user. Examples of the suggestions provided to the user may be, but are not limited to, to shut down applications executing on the device 200 and execute the applications in a power save mode, to avoid fast charging, to report an issue to an authorized service center, and so on. Thus, it is possible to avoid any catastrophe events that may occur due to the SOS developed in the battery 202 and/or the SOH of the battery 202. In addition, a profile of a battery response (i.e., the CLE) to the pulse probe currents may be segmented into different zones, which may segregate the battery 202 into the shorted/or degraded or both the shorted and degraded.

In an embodiment, the BMS controller 204 may perform a pulse current limit test at a different SOC of the battery 202 to estimate a cumulative charge leakage that attributes to the at least one internal short circuit at each SOS value.

The input/output 206 may be configured to enable the user to interact with the device 200. The input/output 206 may also be configured to receive the warning notification and/or suggestions from the BMS controller 204 and provide the warning notification and/or suggestions to the user. The input/output 206 may provide the warning notification and/or suggestions to the user in a form of, an audio, a video, an emoticon, an image, a button, graphics, text, icons, symbols, haptic feedback, vibration signals, and so on.

The communication interface 208 may be configured to enable the device 200 to communicate with any other user device through an interface supported by a communication network. The communication interface 208 may enable the device 200 to communicate with another user device to provide communicate the warning notification and/or the suggestions related to the battery 202. Examples of the interface may be, but are not limited to, a wired interface, a wireless interface, or any structure supporting communications over a wired or wireless connection. Examples of the communication network may be, but are not limited to, the Internet, a Wireless Local Area Network (WLAN), Wireless Fidelity (Wi-Fi), Wi-Fi Direct, Bluetooth, Bluetooth Low Energy (BLE), cellular communications (2G/3G/4G/5G or the like), and so on.

The memory 210 stores at least one of, the instantaneous operating and environment conditions, the operating and environment conditions collected from the ROM-thermal loop, the CLE estimated for the different depths of charge/discharge, information about the detected SOH and the SOS, the short resistance value, the warning notifications, the suggestions, and so on. Examples of the memory 210 may be, but are not limited to, NAND, embedded Multimedia Card (eMMC), Secure Digital (SD) cards, Universal Serial Bus (USB), Serial Advanced Technology Attachment (SATA), solid-state drive (SSD), and so on. Further, the memory 210 may include one or more computer-readable storage media. The memory 210 may include one or more non-volatile storage elements. Examples of such non-volatile storage elements may include Random Access Memory (RAM), Read Only Memory (ROM), magnetic hard discs, optical discs, floppy discs, flash memories, or forms of electrically programmable memories (EPROM) or electrically erasable and programmable (EEPROM) memories. In addition, the memory 210 may, in some examples, be considered a non-transitory storage medium. The term "non-transitory" may indicate that the storage medium is not embodied in a carrier wave or a propagated signal. However, the term "non-transitory" should not be interpreted to mean that the memory is non-movable. In certain examples, a non-transitory storage medium may store data that may, over time, change (e.g., in Random Access Memory (RAM) or cache).

Figure 4:
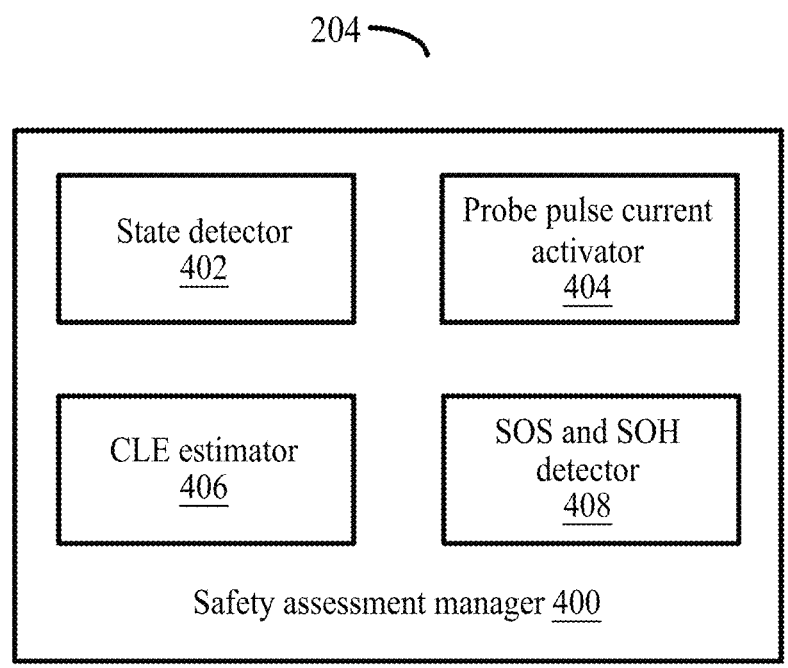
FIG. 4 illustrates an example of a safety assessment manager performable in the device for assessing the safety of the battery.

FIG. 4 depicts an example of a safety assessment manager 400 performable in the device 200 for assessing the safety of the battery 202. The safety assessment manager 400 may be stored in the memory 210 and may be executed by the BMS controller 204 to assess the safety of the battery 202 by detecting and differentiating the SOS and SOH of the battery 202. The safety assessment manager 400 includes a state detector 402, a pulse probe current activator 404, a CLE estimator 406, and a SOS and SOH detector 408.

The state detector 402 may be configured to identity the charge state or the discharge state of the battery 202.

The pulse probe current activator 404 may be configured to activate the pulse probe currents at the different depths of charge/discharge of the battery 202.

The CLE estimator 406 may be configured to estimate the CLE, on activating the pulse probe currents at the different depths of charge/discharge of the battery 202. The CLE may be estimated for detecting and differentiating the SOS and the SOH of the battery 202. The CLE estimator 406 collects the operating or environment conditions of the battery 202 from the ROM-thermal loop. Examples of the operating or environment conditions of the battery 202 collected from the ROM-thermal loop includes at least one of, the current identified in the real-time, the lumped temperature, the lumped resistance, the SOC, and the model parameters. The CLE estimator 406 also collects the inputs such as, but are not limited to, the voltage cut-off, the first-time instance over that the battery 202 sustains the maximum current, and so on. On collecting the inputs, the CLE estimator 406 initially identifies the CLE as the current identified in the real-time. The CLE estimator 406 calculates the SOC for the at least one subsequent time instance as the SOC cut-off. The CLE estimator 406 estimates the CLE for the different depths of charge/discharge based on the open circuit voltage (OCV), the SOC cut-off, the voltage cut-off, and the lumped resistance.

The SOS and SOH detector 408 may be configured to detect and differentiate the SOS and the SOH of the battery 202. The SOS and SOH detector 408 may detect and differentiate the SOS and the SOH of the battery 202 using the CLE estimated for the different depths of charge/discharge.

For detecting and differentiating the SOS and the SOH of the battery, the SOS and SOH detector 408 compares the CLE estimated for the first depth of charge/discharge with the CLE of the fresh cell estimated for the same depth of charge/discharge. If the CLE estimated for the first depth of charge/discharge is greater than the pre-determined amount of the CLE of the fresh cell estimated for the same depth of charge/discharge, the SOS and SOH detector 408 initiates the process for detecting the SOS by detecting no SOH/degradation of the battery 202. If the CLE estimated for the first depth of charge/discharge is lesser than the pre-determined amount of the CLE of the fresh cell estimated for the same depth of charge/discharge, the SOS and SOH detector 408 detects the SOH/degradation of the battery 202. In an exemplary embodiment, on detecting the SOH/degradation of the battery 202, the SOS and the SOH detector 408 checks if the CLE remains same for all the depths of charge/discharge. If the CLE remains same for all the depths of charge/discharge, the SOS and SOH detector 408 detects only the SOH/degradation of the battery 202. If the CLE does not remain same for all the depths of charge/discharge, the SOS and SOH detector 408 initiates the process of detecting the SOS by predicting both the SOS and the SOH of the battery 202.

For detecting the SOS of the battery 202, the SOS and SOH detector 408 compares the CLE estimated for the subsequent depths of charge/discharge (i.e., except the first depth of charge/discharge) with the CLE of the fresh cell estimated for the same depths of charge/discharge. If the CLE estimated for the subsequent depths of charge/discharge is not less than the CLE of the fresh cell estimated for the same depths of charge/discharge, the SOS and SOH detector 408 detects that the battery 202 is healthy. If the CLE estimated for the subsequent depths of charge/discharge is less than the CLE of the fresh cell estimated for the same depths of charge/discharge, the SOS and SOH detector 408 detects the SOS developed in the battery 202.

On detecting the SOS developed in the battery 202, the SOS and SOH detector 408 calculates the short resistance value. The SOS and SOH detector 408 provides the warning notification and/or the suggestions to the user related to the battery 202, if the calculated short resistance value is lesser than the pre-determined resistance value.

FIGS. 2 and 4 show exemplary blocks of the devices 200 and 400, but it is to be understood that other embodiments are not limited thereon. In other embodiments, the device 200 may include less or more number of blocks. Further, the labels or names of the blocks are used only for illustrative purpose and does not limit the scope of the embodiments herein. One or more blocks can be combined together to perform same or substantially similar function in the device 200.

Figure 5:
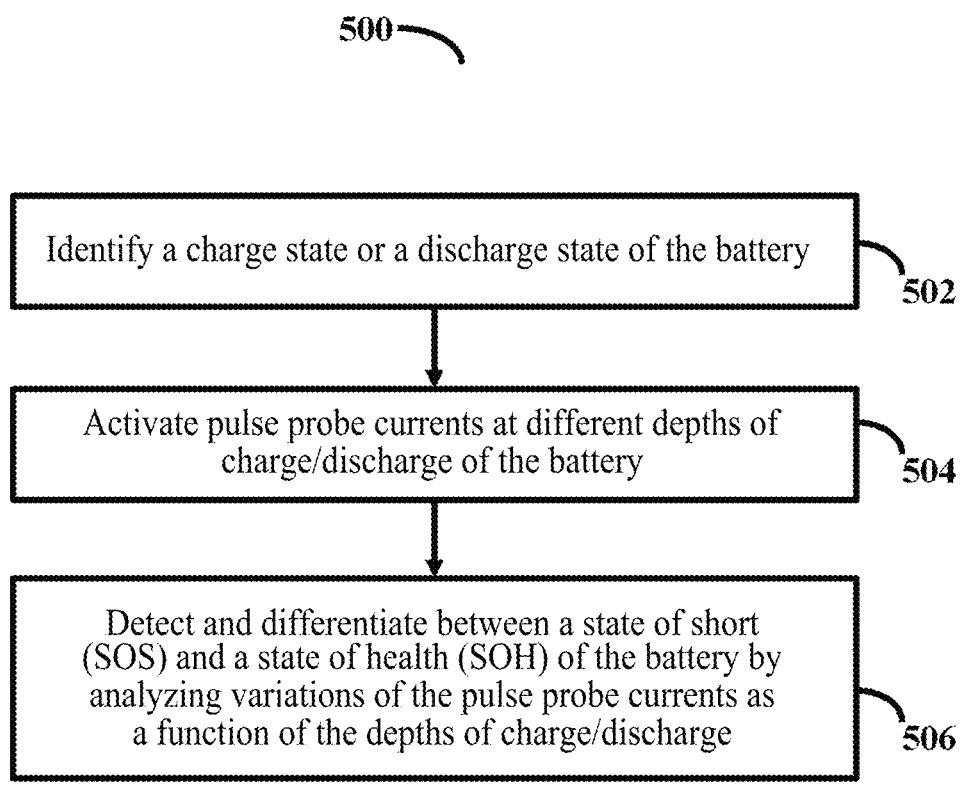
FIG. 5 illustrates an example of a method for assessing the safety of the battery.

FIG. 5 illustrates an example of a method 500 for assessing the safety of the battery 202. The operations in FIG. 5 may be performed in the sequence and manner as shown, although the order of some operations may be changed or some of the operations omitted without departing from the spirit and scope of the illustrative examples described. Many of the operations shown in FIG. 5 may be performed in parallel or concurrently. One or more blocks of FIG. 5, and combinations of the blocks, can be implemented by special purpose hardware-based computer, such as a processor, that perform the specified functions, or combinations of special purpose hardware and computer instructions. In addition to the description of FIG. 5 below, the descriptions of FIGS. 1-4 are also applicable to FIG. 5, and are incorporated herein by reference. Thus, the above description may not be repeated here.

At step 502, the charge state or the discharge state of the battery 202 is identified by the device 200. At step 504, the pulse probe currents at the different depths of charge/discharge of the battery 202 are activate by the device 200, on identifying the charge or discharge state of the battery 202.

At step 506, the device 200 may detect and differentiate between the SOS and the SOH of the battery 202 by analyzing the variation of the pulse probe currents as the function of the depths of charge/discharge. Detecting and differentiation between the SOS and SOH of the battery 202 is further described in FIG. 6.

Figure 6:
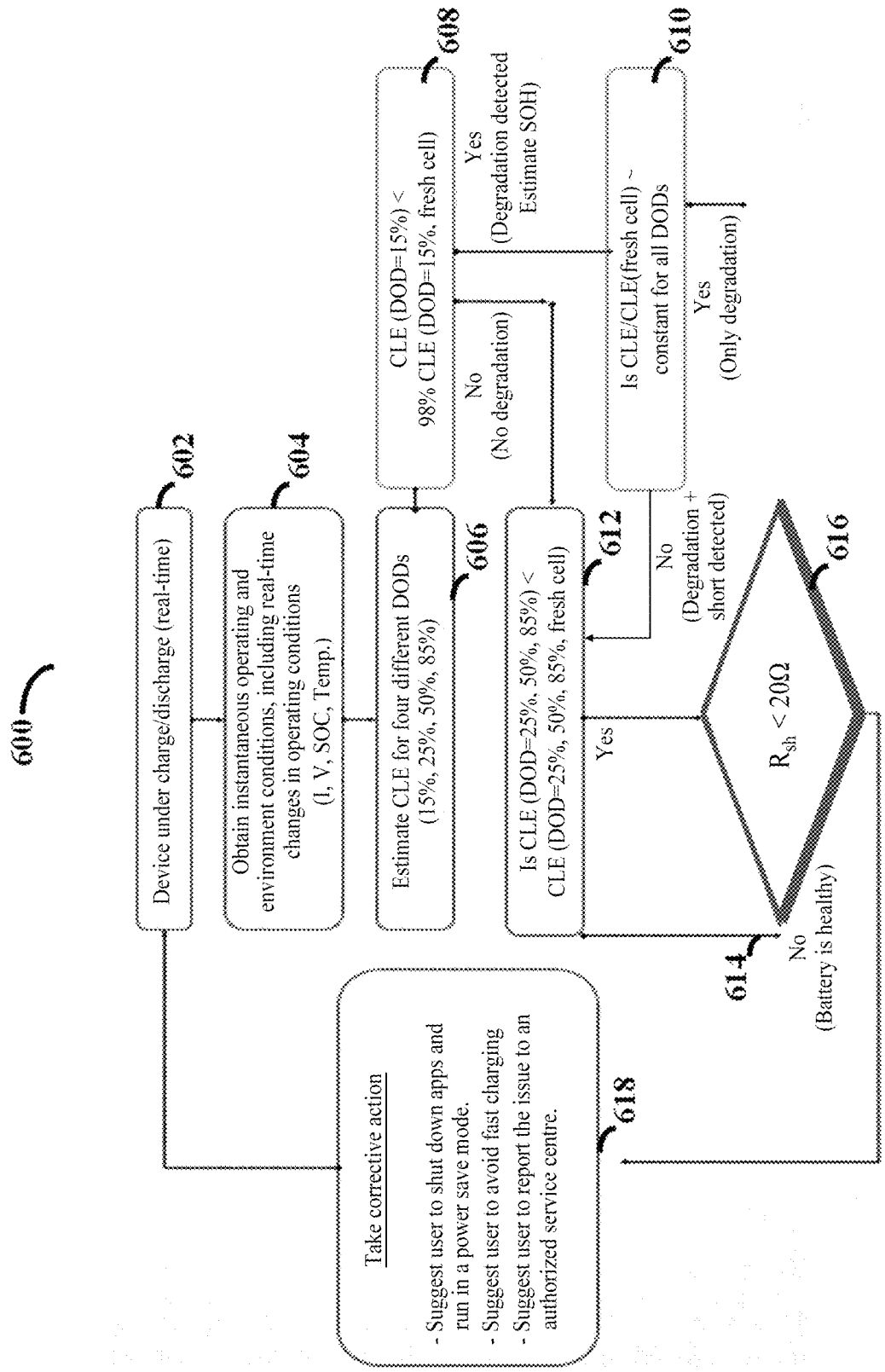
FIG. 6 illustrates an example of a method for detecting and differentiating between a state of short (SOS) and a state of health (SOH) of the battery.

FIG. 6 is a diagram illustrating an example of a method 600 for detecting and differentiating between the SOS and the SOH of the battery 202. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. One or more blocks of FIG. 6, and combinations of the blocks, can be implemented by special purpose hardware-based computer, such as a processor, that perform the specified functions, or combinations of special purpose hardware and computer instructions. In addition to the description of FIG. 5 below, the descriptions of FIGS. 1-5 are also applicable to FIG. 6, and are incorporated herein by reference. Thus, the above description may not be repeated here.

At step 602, the device 200 may identify the charge state or the discharge state of the battery 202 in the real-time to activate the pulse probe currents at the different depths of charge/discharge. At step 604, the device 200 may obtain the instantaneous operating and environment conditions (for example, the current, the voltage, the SOC, the temperature, or the like) including real-time changes in the operating conditions of the battery 202, on activating the pulse probe currents at the different depths of charge/discharge.

At step 606, the device 200 may estimate the CLE for the different depths of charge/discharge (for example herein, for four depths of charge/discharge (DOD)=15%, 25%, 50%, and 80%) based on the obtained instantaneous operating and environment conditions of the battery. The CLE predicts the pulse probe current that the battery 202 sustains over the short period of time before reaching the pre-determined voltage cut-off at the particular SOC and temperature. Estimation of the CLE is further described in FIG. 7.

At step 608, the device 200 may compare the CLE estimated for the first depth of charge/discharge (CLE (DOD=15%)) with the CLE of the fresh cell estimated for the same depth of charge/discharge (CLE (DOD=15%, fresh cell). If the CLE estimated for the first depth of charge/discharge (CLE (DOD=15%)) is not less than the pre-determined amount (for example, 98%) of the CLE of the fresh cell estimated for the same depth of charge/discharge (CLE (DOD=15%, fresh cell), the device 200 may perform step 612.

If the CLE estimated for the first depth of charge/discharge (CLE (DOD=15%)) is less than the pre-determined amount (for example, 98%) of the CLE of the fresh cell estimated for the same depth of charge/discharge (CLE (DOD=15%, fresh cell), at step 610, the device 200 may check if the CLE remains same for all the depths of charge/discharge (DOD=15%, 25%, 50%, and 80%). If the CLE remains same for all the depths of charge/discharge, the device 200 detects only the SOH/degradation of the battery 202. If the CLE does not remain same for all the depths of charge/discharge, the device 200 predicts both the SOS and the SOH of the battery 202 and performs step 612.

At step 612, the device 200 may compare the CLE estimated for all the subsequent depths of charge/discharge (DOD=15%, 25%, 50%, and 80%) with the CLE of the fresh cell estimated for the same depths of charge/discharge (DOD=15%, 25%, 50%, and 80%). If the CLE estimated for all the subsequent depths of charge/discharge is not less the CLE of the fresh cell estimated for the same depths of charge/discharge, at step 614, the device 200 may detect that the battery 202 is healthy.

If the CLE estimated for all the subsequent depths of charge/discharge is less than the CLE of the fresh cell estimated for the same depths of charge/discharge, at step 616, the device 200 detects the SOS in the battery 202, computes the short resistance value, and checks if the short resistance value is less than the pre-determined resistance value (for example, 20Ω). If the short resistance value is less than the pre-determined resistance value, at step 618, the device 200 may provide the warning notification and/or the suggestions to the user related to the battery 202.

Figure 7:
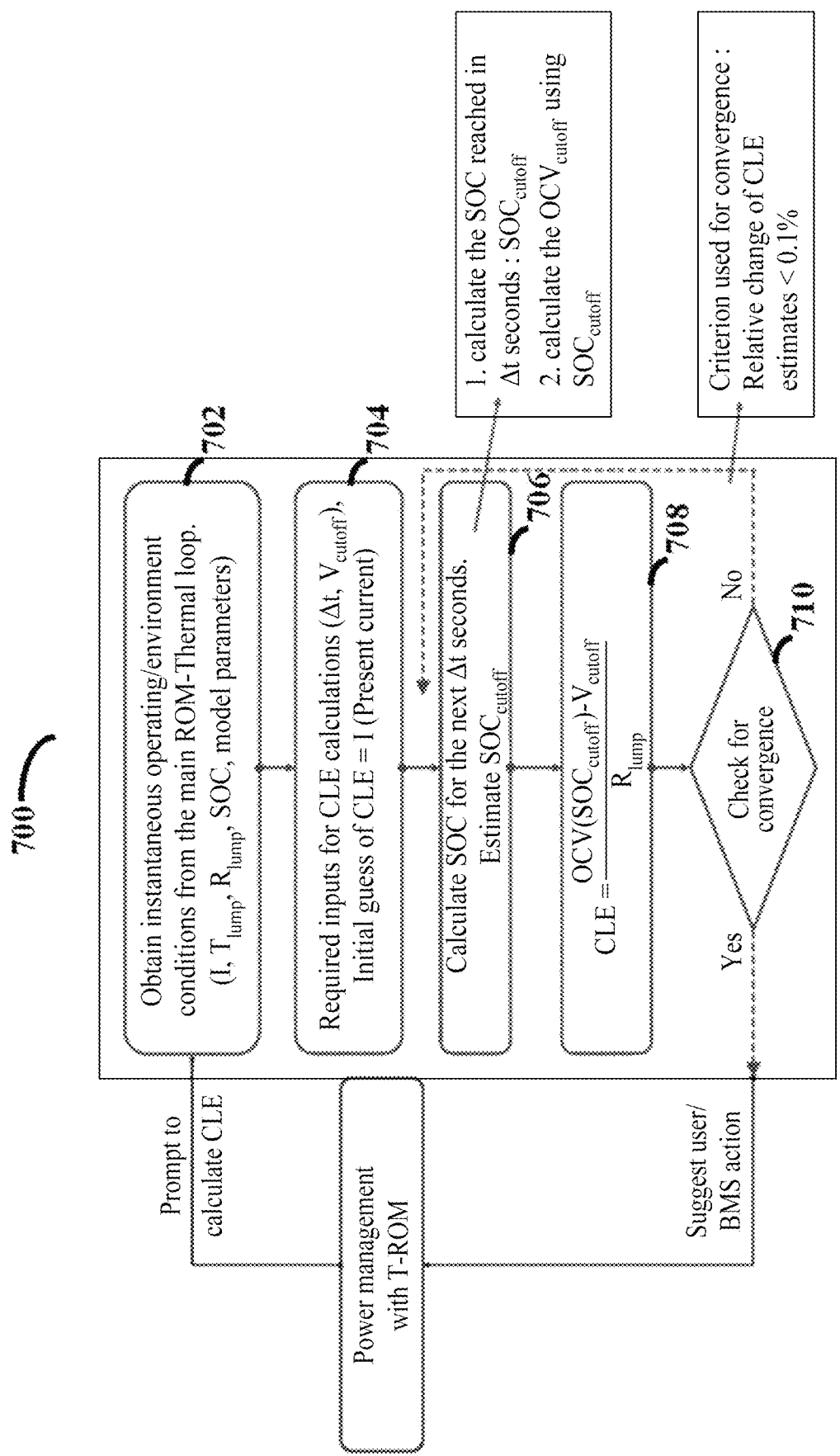
FIG. 7 illustrates an example of a method for estimating a current limit estimate (CLE.

FIG. 7 is a diagram illustrating an example of a method 700 for estimating the CLE. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. One or more blocks of FIG. 7, and combinations of the blocks, can be implemented by special purpose hardware-based computer, such as a processor, that perform the specified functions, or combinations of special purpose hardware and computer instructions. In addition to the description of FIG. 7 below, the descriptions of FIGS. 1-6 are also applicable to FIG. 7, and are incorporated herein by reference. Thus, the above description may not be repeated here.

At step 702, the device 200 may collect the operating or environment conditions of the battery 202 from the ROM-Thermal loop based on the obtained instantaneous operating and environment conditions of the battery 202. In an example, the operating or environment conditions of the battery 202 collected from the ROM-thermal loop includes at least one of, the current identified in the real-time, the lumped temperature, the lumped resistance, the SOC, the model parameters, or the like.

At step 704, the device 200 may collect the inputs for estimating the CLE and initially identifying the CLE as the current identified in the real-time (i.e., a present current), wherein the inputs include at least one of, the voltage cut-off, the first-time instance over that the battery sustains the maximum current, or the like.

At step 706, the device 200 may calculate the SOC for the at least one subsequent time instance as the SOC cut-off and may calculate the OCV using the calculated SOC.

At step 708, the device 200 may estimate the CLE based on the OCV, the SOC cut-off, the voltage cut-off, the lumped resistance, or the like.

At step 710, the device 200 may check if the relative change of the CLE is less than the pre-determined change value (for example, 0.1%). If the relative change of the CLE is less than the pre-determined change value, the device 200 may identify the presence of the convergence and repeats the steps 702-710 until the absence of the convergence or the relative change of the CLE is equal to the pre-determined change value. If the relative change of the CLE is less than the pre-determined change value, the device 200 identifies the absence of the convergence and repeats the steps 706-710, until the presence of the convergence or the relative change of the CLE is equal to the pre-determined change value.

FIG. 8 illustrates an example of a pulse probe current (PPC) matrix depicting an evaluation of the SOS and the SOH of the battery 202. Embodiments herein enable the device 200 to evaluate/detect the SOS and the SOH of the battery 202 based on the CLE estimated for the different depths of charge/discharge on activating the pulse probe currents at the corresponding depths of charge/discharge.

The device 200 detects no SOH/degradation of the battery 202 and no SOS/no short of the battery 202, when the CLE of the battery 202 estimated for all the different depths of charge/discharge is approximately equal to or not less than the CLE of the fresh cell estimated for the same depths of charge/discharge.

The device 200 detects the degradation of the battery 202 and no SOS/short of the battery 202, when the CLE of the battery 202 estimated for the first depth of charge/discharge is less than the CLE of the fresh cell estimated for the same depth of charge/discharge and the CLE of the battery 202 remains same/constant for all the depths of charge/discharge.

The device 200 detects no SOH/degradation of the battery 202 and the SOS/short of the battery 202, when the CLE of the battery 202 estimated for the first depth of charge/discharge is approximately equal to or not less than the CLE of the fresh cell estimated for the same depth of charge/discharge and the CLE of the battery 202 decreases over the different depths of charge/discharge.

The device 200 detects both the SOH/degradation and the SOS/short of the battery 202, when the CLE of the battery 202 estimated for the first depth of charge/discharge is less than the CLE of the fresh cell estimated for the same depth of charge/discharge and the CLE of the battery 202 decreases over the different depths of charge/discharge.

FIGS. 9A-9D are diagrams illustrating examples of plots depicting the analysis of the pulse probe currents at different scenarios of the temperature and the SOC (discharge SOC).

Figure 9A:
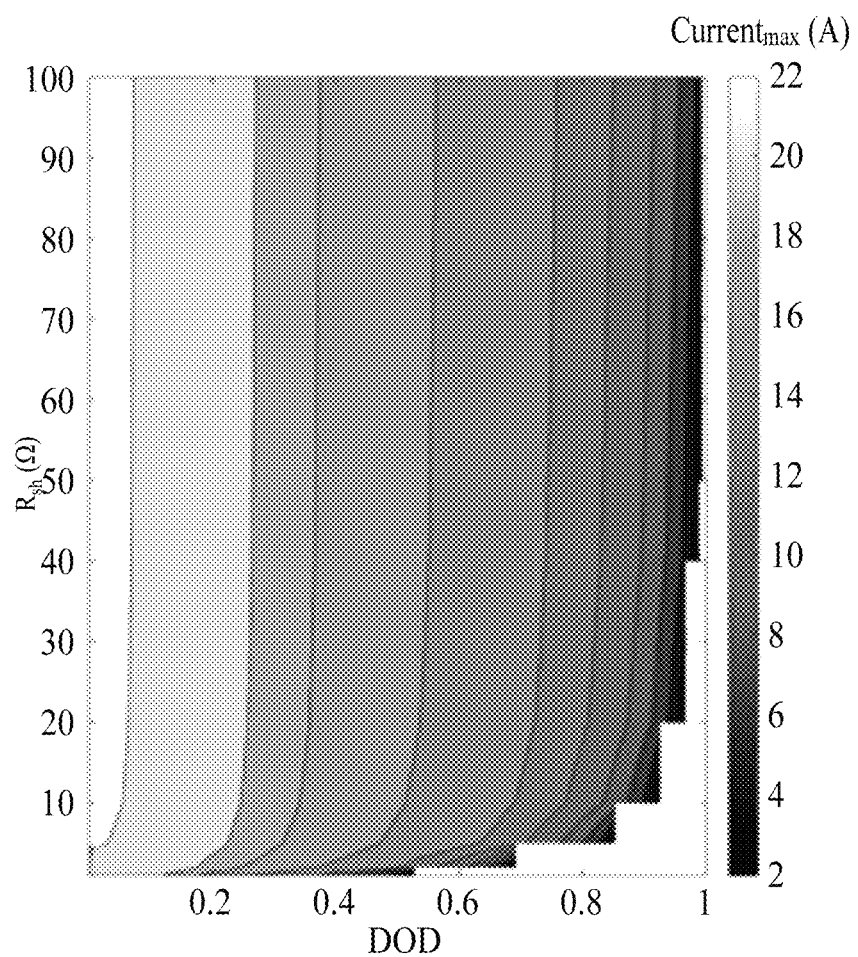
FIGS. 9A-9D illustrate examples of plots depicting analysis of pulse probe currents at different scenarios of the temperature and a state of (dis)charge (SOC) (discharge SOC).
Figure 9B:
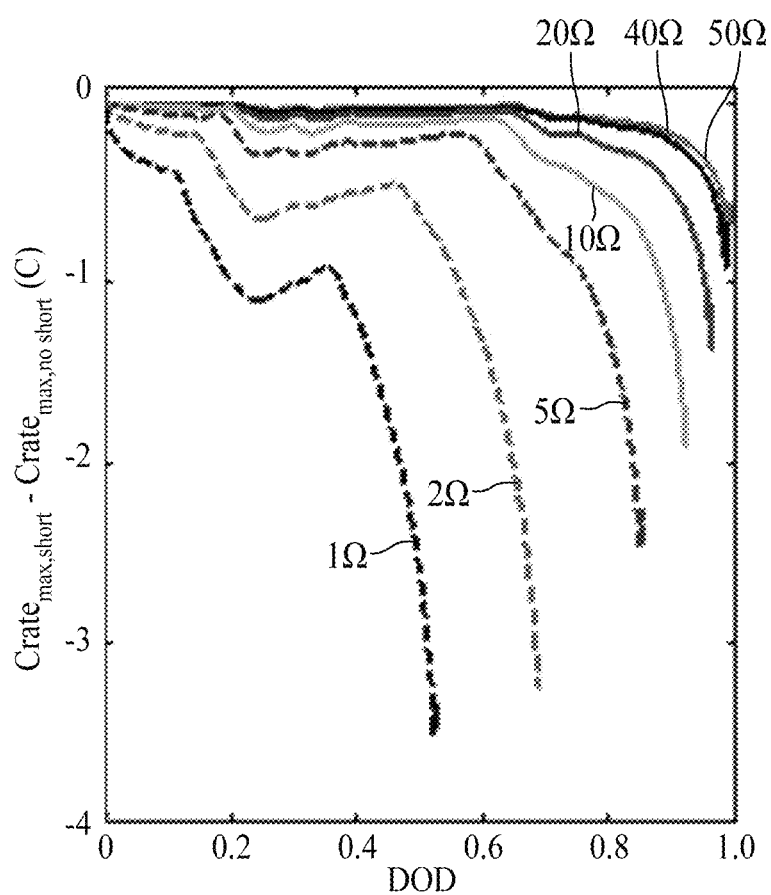
Figure 9C:
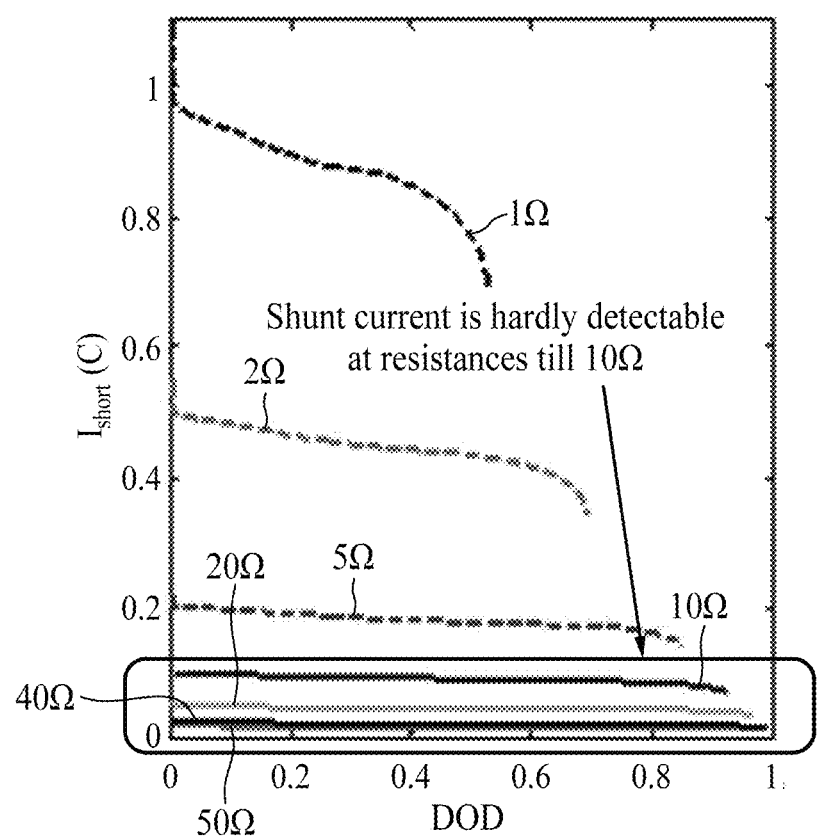

A contour of the variations of the pulse probe currents with respect to the depth of charge/discharge (DOD) and the short resistance is depicted in FIG. 9A. As depicted in FIG. 9A, there may be considerable variations at resistances from 5Ω to 20Ω and at high depths of charge/discharge. A difference in the pulse probe currents between the battery 202 with the short and no short in C-rates is depicted in FIG. 9B. As depicted in FIG. 9B, the difference may range from 0.5 C at moderately high resistances to 4 C at low resistance like 1Ω. Further, the variation of a shunt current ($I_{short}$) in the C-rates (i.e., the current through the short resistance under 1 C discharge) with the depths of charge/discharge for the short resistances is depicted in FIG. 9C. As depicted in FIG. 9C, till the short resistance reaches a lower value of 10 Ω and below, the shunt current is hardly detectable.

Figure 9D:
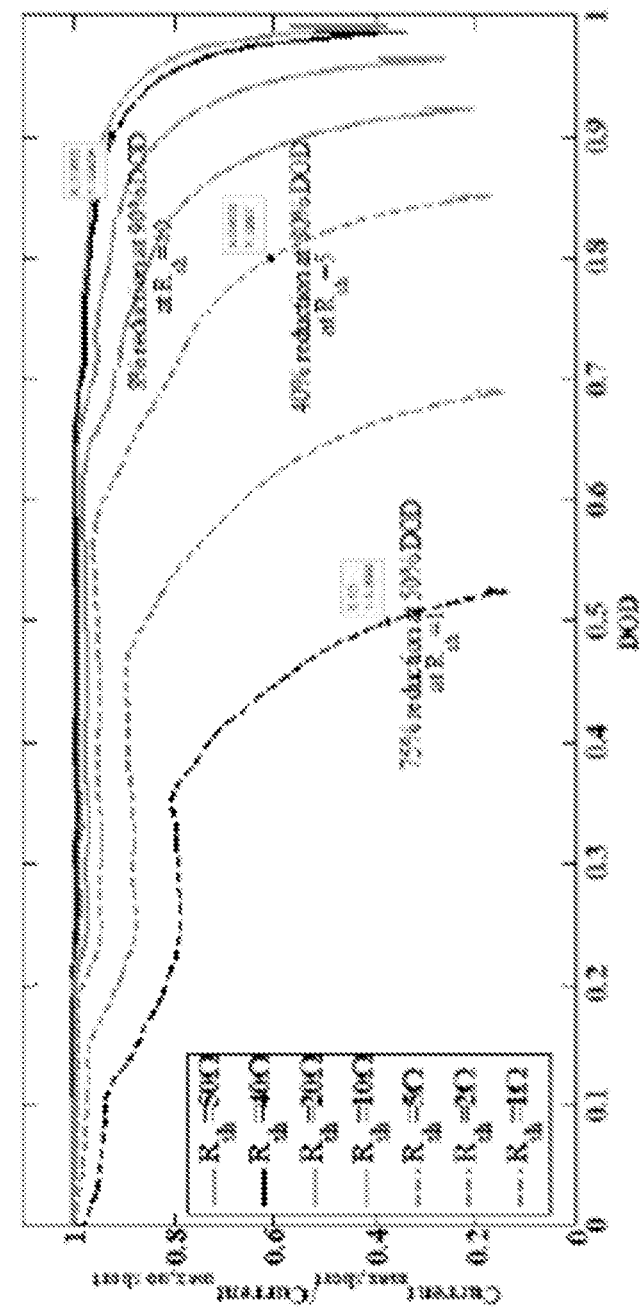

Although the shunt current is hardly detectable at the high short resistances (i.e., the soft short) (as depicted in FIGS. 9A, 9B, and 9C), analysis of the variations of the pulse probe currents as depicted in FIG. 9D illustrates that even at the high short resistance like 40Ω, there may be an 8% reduction at 90% depth of charge/discharge (for example 20% at 95% DOD) in the extractable current (i.e., the CLE), which increases considerably to 40% at 80% DOD, the short resistance ($R_{sh}$=5Ω). Thus, analysing the pulse probe currents at a few depths of charge/discharge may help in detecting the short of the battery 202 at an early stage easily and estimating the short resistance as well.

Figure 10A:
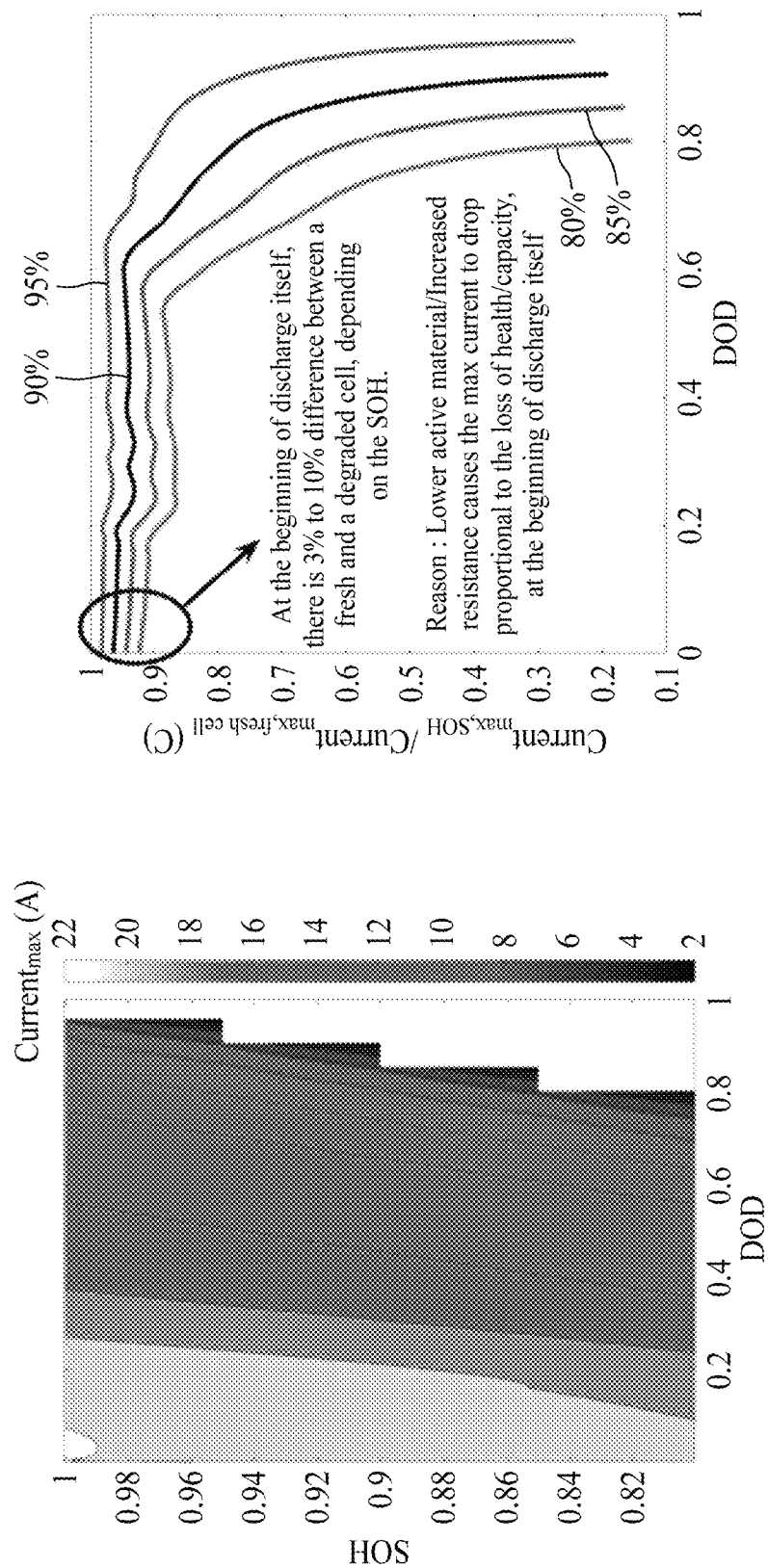

FIGS. 10A and 10B are diagrams illustrating examples of plots depicting the differentiation between the SOH and the SOS of the battery 202.

As depicted in FIGS. 10A, and 10B, although there is a similarity in the way the current extracted decreases with the relevant parameters (for example, the SOC, the short resistance value), there is a qualitative difference between the SOH and the SOS of the battery 202. A SOH variation looks linear, and a SOS/short variation looks exponential.

As depicted in FIG. 10A, at the beginning of discharge, there may be a 3% to 10% difference between the fresh and degraded cell depending on the SOH, since a lower active material of the battery 202 or an increased resistance causes a maximum current to drop proportional to the loss of the health/capacity of the battery 202.

As depicted in FIG. 10B, at the beginning of the discharge till some 20% DOD, there may be hardly any differentiation between the short and no-short scenario, since the capacity of the cell is not altered. However, there may be a leakage current. The leakage current may lead to decrease in electrode SOCs as well as the resistance, which compensates each other on the initial discharge phase. Later, as the SOC depletion is faster with more leakage current, and the decrease is exponential.

Figure 11A:
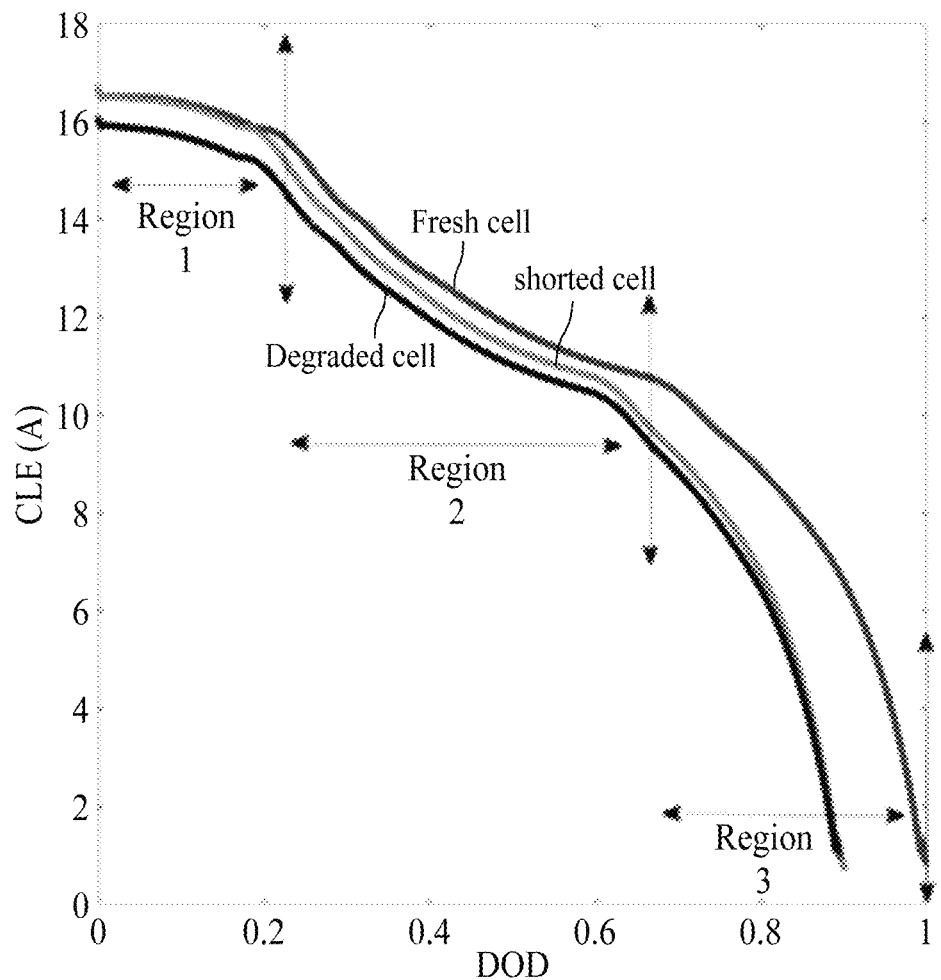
FIGS. 11A-11C illustrate examples of plots depicting the differentiation between the SOH and the SOS of the battery with respect to different regions of differentiation, a lumped resistance variation, and electrode SOC variation.
Figure 11B:
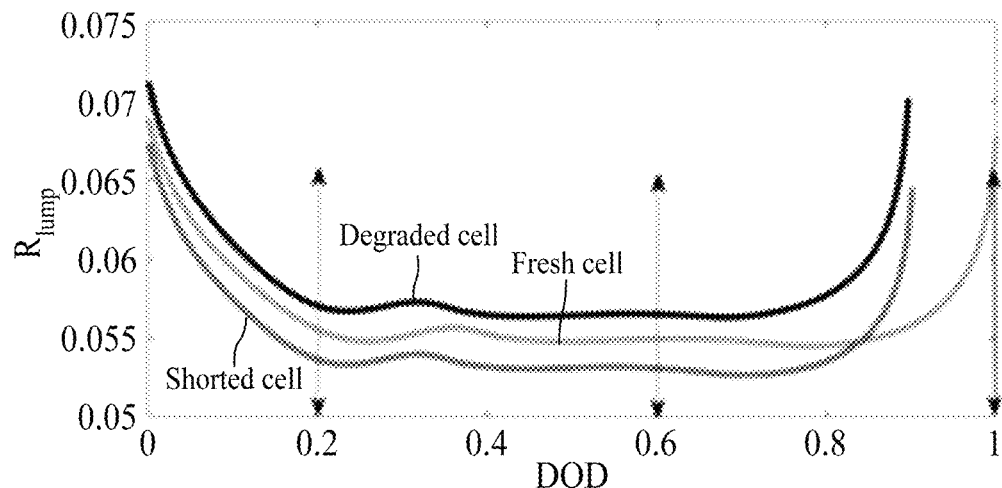
Figure 11C:
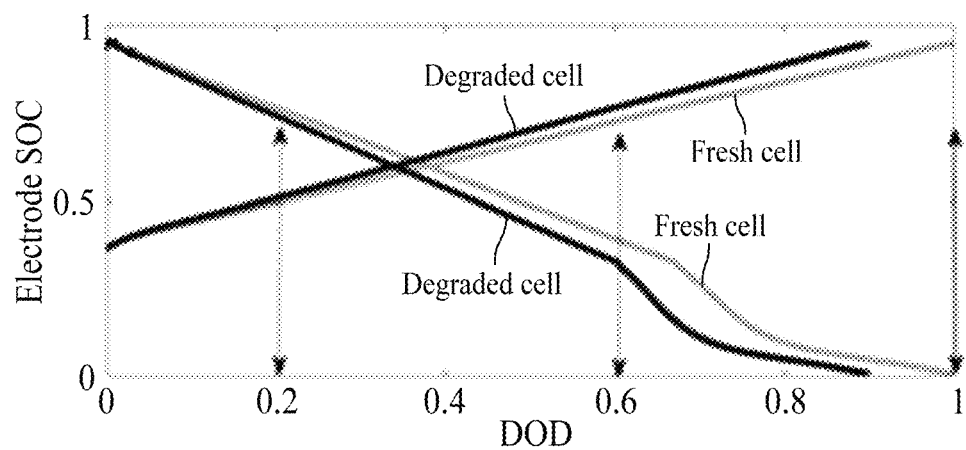

FIGS. 11A-11C are diagrams illustrating examples of plots depicting the differentiation between the SOH and the SOS of the battery 202 with respect to different regions of differentiation, the lumped resistance variation, and electrode SOC variation.

Embodiments herein disclose an accurate method to detect a short of a battery/internal short circuit/state of short (SOS) even in a presence of a degradation of the battery. The method includes detecting the short of the battery without requiring data to be captured over a long period of time or for many cycles. The method may implemented on a lightweight processor (i.e., <1 KiloByte (KB) on a chip)/microcontroller exhibiting good robustness and accuracy and may be used with real-time state (1 ms per calculation) estimation methods.

Conventional approaches fail to detect the short of the battery at an early stage and/or time consuming/data heavy, due to immensely feature centric approaches. In contrast, embodiments herein disclose the method for detecting the short of the battery at the early stage by activating pulse probe currents at specific depths of charge/discharge. The pulse probe currents activated at the various depths of discharge reflect and magnify the accumulated states of the battery. The variations of the pulse probe currents as a function of the depth of charge/discharge reveals and differentiates between the early soft short circuit (SC) and a state of health/ageing (SOH).

Embodiments herein disclose an accurate method, which in real-time, informs a user regarding a health of the battery.

Embodiments disclosed herein have the following advantages: (1) activate the pulse probe currents at the specific depths of charge/discharge for accurate detection of the early soft short of the battery and estimation of a short resistance; (2) differentiate between degradation and short influenced decrease in extractable spike currents; (3) detect and differentiate the degradation/ageing of the battery with and without the short of the battery; and (4) enhance a user experience by providing appropriate alerts regarding battery safety and operation.

Moreover, embodiments disclosed herein have the following advantages: (1) disclose a prognostics model for detection, estimation and differentiation of the soft short and the ageing of the battery; (2) estimate the short resistance/shunt resistance and/or a state of health; (3) provide warning alarms to the user when the short resistance is below a particular threshold short resistance (for example, 40Ω); (4) provide exact delineation of degradation and short induced effects; (5) prevent damage of the battery by intimating the user in real-time and allow a battery management system (BMS) controller to perform a corrective action; (6) enable accurate estimation of the short and ageing of the battery for a wide range of temperatures from 0° C. to 60° C.; and (7) provide real-time updates of parameter variation (for example, SOC variation, lumped resistance variation, or the like) to the user for taking an appropriate action.

Embodiments disclosed herein detect and differentiate between the short of the battery and the degradation/ageing of the battery with the following advantages: (1) functionality: detect/estimate/differentiate the short resistance (for example, <=200Ω) and the state of health; (2) ease of implementation: at least one single pulse (pulse probe current) any time during charge/discharge may spread over at least four different depths of charge/discharge for detecting the short resistance and the SOH of the battery; (3) computing efficiency: fast and easily implementable on any of a processing circuitry; (4) accuracy: improved accuracy (for example, >98% accuracy for R<=200Ω); and (5) flexibility: at least four pulse probe currents may spread over at least one of four different depths of charge/discharge with a total time of 4 milliseconds (ms) of calculation.

In an embodiment, the battery safety assessment device may be a tablet computer, a smartphone, a smartwatch, or other electronic devices having required computing and/or processing ability. The electronic device may include a processor connected via a system bus, a memory, a network interface, and a communication interface. A processor of the electronic device may be used to provide required computing, processing, and/or control functions. A memory of the electronic device may include a non-volatile storage medium. The non-volatile storage medium may store an operating system, a computer program, and the like. The memory may provide an operating system of the non-volatile storage medium and an environment for an operation of the computer program. The network interface and communication interface of the electronic device may be used to connect and communicate with an external device via networks.

The embodiments disclosed herein disclose methods and systems for assessing safety of a battery.

In addition, there is disclosed, methods and systems for identifying a charge state or a discharge state of the battery, activating pulse probe currents at different depths of charge or discharge of the battery, and detecting and differentiating between a state of short (SOS) and a state of health (SOH) of the battery by analyzing variations of the pulse probe currents as a function of the depths of charge/discharge. The device 200 for assessing safety of a battery 202, the BMS controller 204, the safety assessment manager 400, the state detector 402, the pulse probe current activator 404, the CLE estimator 406, the SOS and SOH detector 408, and other apparatuses, devices, units, modules, and components described herein with respect to FIGS. 1 and 4 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. In an example, the instructions or software includes at least one of an applet, a dynamic link library (DLL), middleware, firmware, a device driver, an application program storing the method of method for determining safety of a battery. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), magnetic RAM (MRAM), spin-transfer torque (STT)-MRAM, static random-access memory (SRAM), thyristor RAM (T-RAM), zero capacitor RAM (Z-RAM), twin transistor RAM (TTRAM), conductive bridging RAM (CBRAM), ferroelectric RAM (FeRAM), phase change RAM (PRAM), resistive RAM (RRAM), nanotube RRAM, polymer RAM (PoRAM), nano floating gate Memory (NFGM), holographic memory, molecular electronic memory device), insulator resistance change memory, dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In an example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A processor implemented method for determining safety of a battery, the method comprising:
   identifying, by the processor, a charge state or a discharge state of the battery;
   activating, by the processor, pulse probe currents at different depths of charge or discharge (charge/discharge) of the battery, in response to identifying the charge or discharge state of the battery; and
   detecting and differentiating, by the processor, between a state of short (SOS) and a state of health (SOH) of the battery based on variations of the pulse probe currents as a function of the different depths of charge/discharge,
   wherein the detecting and differentiating between the SOS and the SOH is further based an estimated current limit estimate (CLE) of the battery for the different depths of charge/discharge.

2. The method of claim 1, wherein a pulse probe current comprises a maximum extractable discharge current from the battery at a given depth of charge/discharge and temperature.

3. The method of claim 1, wherein the SOS indicates at least one internal short circuit in the battery and the SOH indicates a degradation of the battery.

4. The method of claim 1, wherein the detecting and differentiating between the SOS and the SOH comprises:
   obtaining operating and environment conditions including real-time changes in operating conditions of the battery in response to the activated pulse probe currents at the different depths of charge/discharge, wherein the operating and environment conditions of the battery comprise any one or any combination of a current, a voltage, a state of (dis)charge (SOC), and a temperature;
   estimating the CLE based on the operating and environment conditions of the battery, wherein the CLE comprises an extractable current with respect to the variations of the activated pulse probe currents at the different depths of charge/discharge;
   comparing the CLE estimated for a first depth of charge/discharge with a CLE of a fresh cell estimated for the same depth of charge/discharge, wherein the fresh cell is of the same or different battery;
   detecting the SOH of the battery, in response to the CLE for the first depth of charge/discharge being less than a pre-determined amount of the CLE of the fresh cell for the same depth of discharge;
   comparing the CLE estimated for all the subsequent depths of charge/discharge of the battery with the CLE of the fresh cell estimated for corresponding depths of charge/discharge, in response to the CLE estimated for the first depth of discharge not being less than the pre-determined amount of the CLE of the fresh cell for the same depth of discharge; and
   detecting the SOS of the battery, in response to the CLE estimated for all the subsequent depths of charge/discharge being less than the CLE of the fresh cell estimated for the corresponding depths of charge/discharge.

5. The method of claim 4, further comprising:
   determining whether the CLE remains constant for all the different depths of charge/discharge, in response to detecting the SOH;
   detecting the SOH of the battery, in response to the CLE remaining constant for all the different depths of charge/discharge; and
   detecting the SOS and the SOH of the battery, in response to the CLE not remaining constant for all the different depths of charge/discharge of the battery.

6. The method of claim 4, wherein the CLE predicts the pulse probe current that the battery sustains over a short period of time before reaching a pre-determined voltage cut-off at a particular SOC and temperature.

7. The method of claim 6, wherein estimating of the CLE comprises:
   collecting operating or environment conditions of the battery from a reduced order model (ROM)-thermal loop based on the operating and environment conditions of the battery, wherein the operating or environment conditions of the battery collected from the ROM-thermal loop comprises any one or any combination of a current identified in a real-time, a lumped temperature, a lumped resistance, the SOC, and model parameters;
   collecting inputs for estimating the CLE, wherein the inputs comprises any one or any combination of, a voltage cut-off, a first-time instance over that the battery sustains the maximum current;
   initially identifying the CLE as the current identified in the real-time;
   calculating the SOC for at least one subsequent time instance as a SOC cut-off; and
   estimating the CLE based on an open circuit voltage, the SOC cut-off, the voltage cut-off, and the lumped resistance.

8. The method of claim 7, further comprising:
   checking if a relative change of the CLE is less than a pre-determined change value;
   detecting a presence of a convergence and estimating the CLE recursively until an absence of the convergence or the relative change of the CLE is equal to the pre-determined change value, in response to the relative change of the CLE being less than the pre-determined change value;
   detecting the absence of the convergence, in response to the relative change of the CLE being greater than the pre-determined change value; and
   recursively calculating the SOC for the subsequent time instance as the subsequent SOC cut-off and estimating the CLE until the presence of the convergence or the relative change of the CLE is equal to the pre-determined change value, in response to detecting the absence of the convergence.

9. The method of claim 4, further comprising: estimating, by the processor, a short resistance value, on detecting the SOS.

10. The method of claim 9, further comprising:
    comparing the estimated short resistance value with a pre-determined resistance value; and
    providing a warning notification to a user, in response to the estimated short resistance value being less than the pre-determined resistance value.

11. The method of claim 1, further comprising: performing, by the processor, a pulse current limit test at a different charge state or discharge state of the battery to estimate a cumulative charge leakage that attributes to the at least one internal short circuit at each SOS value.

12. A device comprising:
    a battery; and
    a battery management system (BMS) controller coupled to the battery configured to, the BMS controller being configured to:
    identify a charge state or a discharge state of the battery;

activate pulse probe currents at different depths of charge or discharge (charge/discharge) of the battery, in response to identifying the charge or discharge state of the battery;

detect and differentiate between a state of short (SOS) and a state of health (SOH) of the battery based on variations of the pulse probe currents as a function of the different depths of charge/discharge, wherein the detection and differentiation between the SOS and the SOH is further based an estimated current limit estimate (CLE) of the battery for the different depths of charge/discharge.

13. The device of claim 12, wherein a pulse probe current comprises a maximum extractable discharge current from the battery at a given depth of charge/discharge and temperature.

14. The device of claim 12, wherein the SOS indicates at least one internal short circuit in the battery and the SOH indicates a degradation of the battery.

15. The device of claim 12, wherein the BMS controller is further configured to:

obtain operating and environment conditions including real-time changes in operating conditions of the battery in response to the activated pulse probe currents at the different depths of charge/discharge, wherein the operating and environment conditions of the battery comprise any one or any combination of, a current, a voltage, a state of (dis) charge (SOC), and a temperature;

estimate the CLE based on the operating and environment conditions of the battery, wherein the CLE comprises an extractable current with respect to the variations of the activated pulse probe currents at the different depths of charge/discharge;

compare the CLE estimated for a first depth of charge/discharge with a CLE of a fresh cell estimated for the same depth of charge/discharge, wherein the fresh cell is of the same or different battery;

detect the SOH of the battery, in response to the CLE for the first depth of charge/discharge being less than a pre-determined amount of the CLE of the fresh cell for the same depth of discharge;

compare the CLE estimated for all the subsequent depths of charge/discharge of the battery with the CLE of the fresh cell estimated for corresponding depths of charge/discharge, in response to the CLE estimated for the first depth of discharge not being less than the pre-determined amount of the CLE of the fresh cell for the same depth of discharge; and detect the SOS of the battery, in response to the CLE estimated for all the subsequent depths of charge/discharge being less than the CLE of the fresh cell estimated for the corresponding depths of charge/discharge.

16. The device of claim 15, wherein the BMS controller is further configured to:

determine whether the CLE remains constant for all the different depths of charge/discharge, in response to detecting the SOH;

detect the SOH of the battery, in response to the CLE remaining constant for all the different depths of charge/discharge; and detect the SOS and the SOH of the battery, in response to the CLE not remaining constant for all the different depths of charge/discharge of the battery.

17. The device of claim 15, wherein the CLE predicts the pulse probe current that the battery sustains over a short period of time before reaching a pre-determined voltage cut-off at a particular SOC and temperature.

18. The device of claim 17, wherein the BMS controller is further configured to:

collect operating or environment conditions of the battery from a reduced order model (ROM)-thermal loop based on the operating and environment conditions of the battery, wherein the operating or environment conditions of the battery collected from the ROM-thermal loop comprises any one or any combination of, a current identified in a real-time, a lumped temperature, a lumped resistance, the SOC, and model parameters;

collect inputs for estimating the CLE, wherein the inputs comprises any one or any combination of, a voltage cut-off, a first-time instance over that the battery sustains the maximum current;

initially identify the CLE as the current identified in the real-time;

calculate the SOC for at least one subsequent time instance as a SOC cut-off; and estimate the CLE based on an open circuit voltage, the SOC cut-off, the voltage cut-off, and the lumped resistance.

19. The device of claim 18, wherein the BMS controller is further configured to:

check if a relative change of the CLE is less than a pre-determined change value;

detect a presence of a convergence and estimating the CLE recursively until an absence of the convergence or the relative change of the CLE is equal to the pre-determined change value, in response to the relative change of the CLE being less than the pre-determined change value;

detect the absence of the convergence, in response to the relative change of the CLE being greater than the pre-determined change value; and recursively calculate the SOC for the subsequent time instance as the subsequent SOC cut-off and estimating the CLE until the presence of the convergence or the relative change of the CLE is equal to the pre-determined change value, in response to detecting the absence of the convergence.

20. The device of claim 15, wherein the BMS controller is further configured to:

estimate a short resistance value, on detecting the SOS of the battery;

compare the estimated short resistance value with a pre-determined resistance value; and provide a warning notification to a user, in response to the estimated short resistance value being less than the pre-determined resistance value.

* * * * *